United States Patent [19]

Spence

[11] Patent Number: 6,059,935
[45] Date of Patent: *May 9, 2000

[54] DISCHARGE METHOD AND APPARATUS FOR GENERATING PLASMAS

[75] Inventor: Paul D. Spence, Greenville, S.C.

[73] Assignee: The University of Tennessee Research Corporation, Knoxville, Tenn.

[*] Notice: This patent is subject to a terminal disclaimer.

[21] Appl. No.: 09/218,572

[22] Filed: Dec. 22, 1998

Related U.S. Application Data

[63] Continuation of application No. 08/719,588, Sep. 25, 1996, Pat. No. 5,895,558, which is a continuation of application No. 08/492,193, Jun. 19, 1995, abandoned.

[51] Int. Cl.$^7$ ..................................................... B01J 19/08
[52] U.S. Cl. .......................... 204/156; 204/164; 204/165; 422/186.03; 422/186.05
[58] Field of Search ................................... 204/164, 165, 204/156; 422/186.03, 186.05

[56] References Cited

U.S. PATENT DOCUMENTS

| | | | |
|---|---|---|---|
| 1,169,428 | 1/1916 | Rogers | 361/213 |
| 1,394,064 | 10/1921 | Chapman | 361/214 |
| 2,327,695 | 8/1943 | Beregh | 175/264 |
| 2,333,213 | 11/1943 | Slayter | 175/264 |
| 2,740,184 | 4/1956 | Thomas | 28/78 |

(List continued on next page.)

FOREIGN PATENT DOCUMENTS

| | | |
|---|---|---|
| 068775 | 1/1983 | European Pat. Off. . |
| 117561 | 9/1984 | European Pat. Off. . |
| 245108 | 11/1987 | European Pat. Off. . |
| 305620 | 10/1991 | European Pat. Off. . |
| 292582 | 8/1991 | Germany . |
| 58-0200529 | 11/1983 | Japan . |
| 61-1177374 | 8/1986 | Japan . |
| 62-2544 | 1/1987 | Japan . |
| 0312223 | 12/1990 | Japan . |
| 4225226 | 8/1992 | Japan . |
| 480202 | 8/1975 | Russian Federation . |
| 1493183 | 11/1977 | United Kingdom . |
| WO 94/28568 | 12/1994 | WIPO . |

OTHER PUBLICATIONS

"Specialty Nonwovens with Enhanced Filtration Performance", Adams, J., INDA Association of the Nonwoven Fabrics Industry, Mar. 12–14, 1991.

(List continued on next page.)

*Primary Examiner*—Kishor Mayekar
*Attorney, Agent, or Firm*—Steve Mendelsohn

[57] ABSTRACT

Two methods and corresponding electrode designs are provided for the generation of a plasma, for example, at or about one atmosphere. Using these methods, various webs, films and three-dimensional objects are beneficially treated in a reduced amount of time. A first method utilizes a repetitive, asymmetric voltage pulse to generate a plasma discharge between two electrodes. An asymmetric voltage pulse is used to generate a discharge in which a substrate can be exposed predominately to either positive or negative plasma species depending on the voltage polarity used. A second method uses the gap capacitance of an electrode pair and an external inductor in shunt to form a resonant LC circuit. The circuit is driven by a high power radio frequency source operating at 1 to 30 MHz to generate a uniform discharge between the electrode pair. Both methods have temperature controlled discharge surfaces with supply gas temperature, humidity and flow rate control. The gas flow is typically sufficient to cause a turbulent flow field in the discharge region where materials are treated. Electrode pairs implement these methods and include a metal faced electrode and a dielectric covered electrode, one or both of which have a series of holes extending through the electrode face for supply gas flow. The second of the above-described methods will also operate with paired, metal faced electrodes, but under more restricted operating conditions.

44 Claims, 12 Drawing Sheets

U.S. PATENT DOCUMENTS

| | | | |
|---|---|---|---|
| 2,946,541 | 7/1960 | Boyd | 244/42 |
| 2,969,463 | 1/1961 | McDonald | 250/49.5 |
| 3,067,119 | 12/1962 | Ramaika | 204/168 |
| 3,095,163 | 6/1963 | Hill | 244/12 |
| 3,111,605 | 11/1963 | Muller et al. | 317/4 |
| 3,162,398 | 12/1964 | Clauser et al. | 244/14 |
| 3,274,088 | 9/1966 | Wolinski | 204/165 |
| 3,274,090 | 9/1966 | Amborski | 204/165 |
| 3,281,347 | 10/1966 | Windrr | 204/168 |
| 3,308,045 | 3/1967 | Sullivan | 204/165 |
| 3,308,344 | 3/1967 | Smith et al. | 317/2 |
| 3,360,220 | 12/1967 | Meyer | 244/42 |
| 3,503,859 | 3/1970 | Goncarous et al. | 204/165 |
| 3,507,348 | 4/1970 | Aronson | 180/65 |
| 3,507,763 | 4/1970 | McBride | 204/169 |
| 3,510,094 | 5/1970 | Clark | 244/130 |
| 3,643,128 | 2/1972 | Testour | 317/4 |
| 3,661,735 | 5/1972 | Drelica | 204/165 |
| 3,705,844 | 12/1972 | Haas | 204/312 |
| 3,777,164 | 12/1973 | Osman | 204/165 |
| 3,959,104 | 5/1976 | Fales | 204/164 |
| 4,048,364 | 9/1977 | Harding et al. | 428/113 |
| 4,088,731 | 5/1978 | Groome | 264/168 |
| 4,215,682 | 8/1980 | Kubik et al. | 128/205.29 |
| 4,239,973 | 12/1980 | Kolbe et al. | 250/531 |
| 4,273,635 | 6/1981 | Beraud et al. | 204/165 |
| 4,284,490 | 8/1981 | Weber | 204/298 |
| 4,375,718 | 3/1983 | Wadsworth et al. | 29/592 E |
| 4,419,869 | 12/1983 | Sands et al. | 204/165 |
| 4,426,597 | 1/1984 | Denoyre et al. | 313/231.41 |
| 4,464,223 | 8/1984 | Gorin | 156/643 |
| 4,465,547 | 8/1984 | Belke, Jr. et al. | 156/629 |
| 4,469,932 | 9/1984 | Spiegelberg et al. | 219/75 |
| 4,504,349 | 3/1985 | Ueno et al. | 156/629 |
| 4,513,049 | 4/1985 | Yamasaki et al. | 428/194 |
| 4,534,842 | 8/1985 | Arnal et al. | 204/298 |
| 4,534,918 | 8/1985 | Forrest, Jr. | 264/22 |
| 4,576,692 | 3/1986 | Fukuta et al. | 204/165 |
| 4,588,537 | 5/1986 | Klasse et al. | 264/22 |
| 4,590,042 | 5/1986 | Drage | 422/186.06 |
| 4,592,815 | 6/1986 | Nakao | 204/165 |
| 4,626,263 | 12/1986 | Inoue et al. | 55/155 |
| 4,668,366 | 5/1987 | Zarowin | 156/643 |
| 4,687,573 | 8/1987 | Miller et al. | 210/143 |
| 4,771,730 | 9/1988 | Tezuka | 118/723 |
| 4,801,435 | 1/1989 | Tylko | 422/186.04 |
| 4,804,431 | 2/1989 | Ribner | 156/345 |
| 4,874,659 | 10/1989 | Ando et al. | 428/221 |
| 4,883,570 | 11/1989 | Efthimion | 204/164 |
| 4,894,131 | 1/1990 | Jacobs et al. | 204/165 |
| 4,904,174 | 2/1990 | Moosmayer et al. | 264/22 |
| 4,919,968 | 4/1990 | Buhl et al. | 427/37 |
| 4,931,135 | 6/1990 | Horiuchi et al. | 156/643 |
| 4,950,531 | 8/1990 | Radwanski | 428/284 |
| 4,968,374 | 11/1990 | Tsukada et al. | 156/345 |
| 4,968,918 | 11/1990 | Kondo et al. | 315/111.21 |
| 4,970,104 | 11/1990 | Radwanski | 428/284 |
| 4,980,022 | 12/1990 | Fujimura et al. | 156/643 |
| 4,989,006 | 1/1991 | Roth | 342/1 |
| 4,997,600 | 3/1991 | Okumura et al. | 264/22 |
| 5,024,819 | 6/1991 | Dintner et al. | 204/164 |
| 5,051,159 | 9/1991 | Togashi et al. | 204/165 |
| 5,061,359 | 10/1991 | Babu et al. | 156/345 |
| 5,102,496 | 4/1992 | Sauas | 156/643 |
| 5,116,444 | 5/1992 | Fox | 156/244.17 |
| 5,122,048 | 6/1992 | Deeds | 425/174.8 E |
| 5,124,173 | 6/1992 | Uchiyama et al. | 427/444 |
| 5,126,635 | 6/1992 | Doehler et al. | 315/111.21 |
| 5,131,992 | 7/1992 | Church et al. | 204/164 |
| 5,131,993 | 7/1992 | Suib | 204/168 |
| 5,147,493 | 9/1992 | Nishimura | 156/345 |
| 5,162,633 | 11/1992 | Sonobe et al. | 219/121.43 |
| 5,163,458 | 11/1992 | Monroe | 134/1 |
| 5,185,132 | 2/1993 | Horilke et al. | 422/186.05 |
| 5,213,658 | 5/1993 | Ishida | 156/643 |
| 5,221,427 | 6/1993 | Koinuma et al. | 156/643 |
| 5,225,659 | 7/1993 | Kusano et al. | 249/121.59 |
| 5,227,172 | 7/1993 | Deeds | 425/72.2 |
| 5,244,482 | 9/1993 | Boehler, Jr. et al. | 55/528 |
| 5,252,178 | 10/1993 | Moleshi | 134/1 |
| 5,261,965 | 11/1993 | Moleshi | 134/1 |
| 5,266,153 | 11/1993 | Thomas | 156/643 |
| 5,270,137 | 12/1993 | Kubuta | 429/249 |
| 5,272,417 | 12/1993 | Oami | 315/111.21 |
| 5,275,665 | 1/1994 | Okazaki et al. | 118/723 E |
| 5,309,063 | 5/1994 | Singh | 315/111.51 |
| 5,316,739 | 5/1994 | Yoshikawa et al. | 422/186.05 |
| 5,387,842 | 2/1995 | Roth et al. | 315/111.21 |
| 5,401,446 | 3/1995 | Tsai et al. | 204/165 |
| 5,403,453 | 4/1995 | Roth et al. | 204/164 |
| 5,414,324 | 5/1995 | Roth et al. | 315/111.21 |
| 5,415,719 | 5/1995 | Akimoto | 156/345 |
| 5,433,832 | 7/1995 | Rich et al. | 204/164 |
| 5,441,550 | 8/1995 | Boehler, Jr. et al. | 55/486 |
| 5,443,606 | 8/1995 | Boehler, Jr. et al. | 55/486 |
| 5,456,798 | 10/1995 | Gupta et al. | 156/643.1 |
| 5,456,972 | 10/1995 | Roth et al. | 428/224 |
| 5,464,499 | 11/1995 | Moleshi et al. | 134/1 |
| 5,507,874 | 4/1996 | Su et al. | 134/1 |
| 5,531,862 | 7/1996 | Otsubo et al. | 156/643.1 |
| 5,695,619 | 12/1997 | Williamson et al. | 204/177 |
| 5,895,558 | 4/1999 | Spence | 204/164 |

OTHER PUBLICATIONS

"Synthetic Electret Filter Media for HEPA Filtration", Andon Katsutoshi, INDA Association of the Nonwoven Fabrics Industry, (undated).

"Laser Gain Characterization of Near–Atmospheric $CO_2:N_2$:He Glows in a Planar Electrode Geometry", Denes, L. et al., J. Appl. Phys., Sep., 1973, vol. 44, No. 9, pp. 4125–4136.

"Plasma Modification of Polymer Surfaces for Adhesion Improvement", Egitto, F. et al., IBM J. Res. Develop., Jul., 1999, vol. 38, No. 4, pp. 423–439.

"The Silent Discharge and its Application to Ozone and Excimer Formation", Eliasson, B. et al., Nonequilibrium Processes in Partially Ionized Gases, 1990, pp. 401–410, Plenum Press, N.Y., no month available.

"Stable Glow Plasma at Atmospheric Pressure", Kanazawa, S. et al., J. Phys. D: Appl. Phys., 1988, vol. 21, pp. 838–840, no month available.

"Atmospheric Pressure Glow Plasma and its Application to Surface Treatment and Film Deposition", Kanda, N. et al., International Symposium on Plasma Chemistry, Symposium Proceedings, 1991, vol. 3, Bochum, Germany, Aug. 4–9.

"Surface Modification of Polypropylene in an Impulse Corona Discharge", Kim, S., Korean Journal of Chemical Engineering, 1996, 13(1), pp. 97–100, no month available.

"Wettability Control of a Plastic Surface by $CF_4$—$O_2$ Plasma and Its Etching Effect", Kogoma, M. et al., J. Phys. D: Appl. Phys., 1987. vol. 20, no month available.

"Plasma–Related Characteristics of a Steady–State Glow Discharge at Atmospheric Pressure", Liu, C., Presented at the 1993 Sigma XI Graduate Student Paper Comp. The Univ. of Tennessee, Knoxville, TN, Mar. 4, 1993.

"Characteristics of a Steady–State, Low Power Glow Discharge at Atmospheric Pressure", Liu, C. and Roth, J.R., Bulletin of the Am. Phys. Society, Series II, Nov., 1992, vol. 37, No. 6, p. 1563 et seq.

"Ion Wind Drag Reduction", Malik, M.R. et al., AIAA 21st Aerospace Sciences Meeting (AIAA–83–0231), Jan. 10–13, 1983, Reno, Nevada.

"Plasma Modification of Wool Under Industrial Conditions", Rakowski, W., Melliand Textilberichte, 1989 (no month available), vol. 70, pp. 780–785.

"Effect and Cost of Plasma Treatment of Polypropylene Melt Blown Webs", Rakowski, W., Second Annual TANDEC Conference, Oct. 13–16, 1992.

"Power Modulation for Dielectric Barrier–Discharges", Reitz, H. et al., Paper presented at Twentieth Power Modulator Symposium, 1992, no month available.

"Experimental Generation of a Steady–State Glow Discharge at Atmospheric Pressure", Roth, J.R. et al., 1992 (19th) IEEE Int. Conference on Plasma Science, Conference Record–Abstracts, Paper 5P–21, IEEE Catalog No. 92–TH0460–6, ISBN 0–7803–0716–X, Jun. 1–3, 1992, pp. 170–171, Tampa, FL.

"Plasma–Related Characteristics of a Steady–State Glow Discharge at Atmospheric Pressure", Roth, J.R. et al., Paper 2P–18, Proc. 1993 IEEE Int. Conf. on Plasma Science, Vancouver, B.C. IEEE Catalog No. 93–CH3334–0, ISBN 0–7803–1360–7, 1993 (no month available), p. 129.

"Preliminary Measurements of the Plasma Properties of a One Atmospher Glow Discharge Plasma", Roth, J.R. et al., Paper presented at 35th Ann. Meeting of APS Div. of Plasma Physics, APS Bulletin, Series II, Nov. 1–5, 1993, vol. 38, No. 10, No. 10, p. 1901, St. Louis, MO.

"Plasma–Assisted Deposition at Atmospheric Pressure", Salge, J., Journal De Physique IV, Symposium C5–583, Supplement to Journal de Physique II, vol. 5, Jun., 1995.

"A New Approach to the Copper/Epoxy Joint Using Atmospheric Pressure Glow Discharge", Sawada, Y. et al., J. Adhesion, 1995, vol. 53, pp. 173–182, no month available.

"Some Properties of Radio Frequency Gas Discharges in Air at a Atmospheric Pressure", Schwab, H., Proceedings of the IEEE, Apr., 1971, vol. 59, No. 4.

"Contribution to the Production of Melt–Blown Nonwovens", Szucht, E., Melliand English—Translation of Milliland Textiberichte 72, Apr., 1991, p. 270.

"Electret Filters for High–Efficiency Air Cleaning", Van Turnhout, Jr., Journal of Electrostatics, 1980 (no month available), 8, pp. 369–379.

"Changes in Surface Properties of Poly(ethylene terephthalate) Treated with Low Temperature Plasma: Effect of Pretreatment with Dimehtylformamide", Wakida, T. et al., Sen–I Gakkaishi, 1986 (no month available), vol. 42, No. 2.

"Surface Free Energy of Poly(ethylene Terephthalate) and Nylon 6 Films Treated With Low Temperature Plasma", Wakida, T. et al., Sen–I Gakkaishi, 1987 (no month available), vol. 43, No. 7.

"High–Pressure Laser Action in 13 Gases with Transverse Excitation", Wood, O.R. et al., Applied Physics Letters, 1971, vol. 18, No. 4, pp. 112–115, Feb. 15.

"The Mechanism of the Stabilization of Glow Plasma at Atmospheric Pressure", Yokoyama, T. et al., J. Physics D.: Appl. Phys., 1990 (no month available), vol. 23, pp. 1125–1128.

"Plasma–Related Characteristics of a Steady–State Glow Discharge at Atmospheric Pressure", Roth et al., Publication Paper 2P–18, Proc. 1993 IEEEE International Conference on Plasma Science, 1993 (no date available), Vancouver, B.C., p. 129.

DISCHARGE METHOD AND APPARATUS FOR GENERATING PLASMAS

CROSS-REFERENCE TO RELATED APPLICATIONS

This is a continuation of application Ser. No. 08/719,588, filed on Sep. 25, 1996, now U.S. Pat. No. 5,895,558, which is a continuation of application Ser. No. 08/492,193, filed on Jun. 19, 1995, now abandoned.

BACKGROUND OF THE INVENTION

1. Field of the Invention

The present invention relates generally to methods and apparatus for generating a plasma at or about one atmosphere, especially for purposes of treating various webs and films to enhance their properties, and to the treated webs and films, which have the improved and desirable properties.

2. Description of the Related Art

The surface treatment of polymer materials using a plasma discharge can lead to a broad range of improved results. A plasma discharge can be used to initiate chemical reactions on the surface of a substrate or roughen a surface from ion bombardment. One important benefit that can be achieved is to provide a more hydrophilic, or wettable surface. Plasmas produced under a vacuum have produced hydrophilic surfaces. However, this effect is typically short term for vacuum plasma treated materials. Recent experiments using a one atmosphere dielectric barrier discharge, with a sinusoidal excitation of a few kilohertz, have produced meltblown polypropylene samples which were wettable for eight months, and longer. However, the treatment times for these samples were generally on the order of four to five minutes, which is considered relatively long for practical applications.

By controlling certain processes of the plasma/substrate interaction, and by exploiting various features associated with a one atmosphere discharge, higher plasma power densities and shorter treatment times can be obtained. When exposed to a plasma, a substrate will be bombarded by electrons, ions, radicals, neutrals and ultraviolet (UV) radiation which is sometimes sufficient to cause sputtering or etching of the exposed surface. The resulting volatile products are likely to contaminate the working gas and can be redeposited on the substrate. Sufficient gas flow within the discharge zone can minimize these problems. However, in addition to etching and roughening the substrate, ions can react chemically with the substrate.

The energy and flux of ions to the substrate can be significantly increased by biasing the substrate, usually to a negative potential. Controlled substrate biasing for a high pressure discharge requires metal faced electrodes or an asymmetric voltage waveform when using a dielectric barrier discharge. A symmetric or sinusoidal waveform will alternately bias a substrate positively and then negatively throughout a cycle, partially reversing the effects produced by each half cycle.

The energetic UV radiation produced by a plasma can have a variety of effects on both the background gas and the polymer substrate. Vacuum UV (primarily at short wavelengths, typically 50 to 250 nm) can cause photoionization and bond dissociation yielding free radicals. Radicals produced on a polymer surface can cause crosslinking of a polymer chain or react with species present in the gas phase. For the production of a hydrophilic surface, oxygen or oxygen containing radicals must typically be present. Since many competing reactions will occur in an oxygen containing gas phase, and since these reactions will have temperature dependent reaction rates, proper control of the background gas temperature will result in higher concentrations of the appropriate species to enhance a given surface treatment.

Ultraviolet production in a gas phase discharge can be enhanced by the use of a gas with accessible emission lines (in the UV) for the operating mode of the discharge. Proper electrode geometry with metal faced electrodes reflective to UV, and a dielectric barrier transparent to UV, will enhance the UV levels in the gas discharge.

SUMMARY OF THE INVENTION

It is therefore the primary object of the present invention to provide for the improved treatment of webs and films, especially those formed of polymer materials, with a plasma generated, for example, at or about one atmosphere of pressure and in a relatively short period of time.

It is also an object of the present invention to provide webs and films, especially those formed of polymer materials, which have been treated with a plasma generated, for example, at or about one atmosphere of pressure to enhance their properties, especially in terms of their wettability (hydrophilicity) or non-wettability (hydrophobicity).

It is also an object of the present invention to provide improved methods for treating such webs and films to enhance their properties, especially in terms of their wettability (hydrophilicity) or non-wettability (hydrophobicity) as well as other desirable properties such as printability, especially for films.

It is also an object of the present invention to provide methods for treating such webs and films to achieve the foregoing improvements, which exhibit relatively short exposure times while avoiding the potential for damage to the substrate which is to be treated.

It is also an object of the present invention to provide apparatus for implementing the foregoing methods, for the treatment of webs and films to suitably enhance their properties.

It is also an object of the present invention to provide electrode designs for implementing the foregoing methods.

It is also an object of the present invention to provide corresponding circuit designs for suitably exciting the electrodes of the present invention.

These and other objects which will become apparent are achieved in accordance with the present invention by two methods and corresponding electrode designs for the generation of a plasma, for example, at or about one atmosphere.

A first method utilizes a repetitive, asymmetric voltage pulse to generate a plasma discharge between two electrodes. An asymmetric voltage pulse is used to generate a discharge in which a substrate can be exposed predominately to either positive or negative plasma species depending on the voltage polarity used. A second method uses the gap capacitance of an electrode pair and an external inductor in shunt to form a resonant LC circuit. The circuit is driven by a high power radio frequency source operating at 1 to 30 MHz to generate a uniform discharge between the electrode pair.

Both methods have temperature controlled discharge surfaces with supply gas temperature, humidity and flow rate control. The gas flow is typically sufficient to cause a turbulent flow field in the discharge region where materials are treated. Such methods are generally intended to operate within a metal enclosure to allow containment of the working gas and to provide shielding of the electromagnetic fields.

The foregoing methods are preferably practiced with an electrode pair including a metal faced electrode and a dielectric covered electrode, one or both of which have a series of holes extending through the electrode face for supply gas flow. The second of the above-described methods will also operate with paired, metal faced electrodes, but under more restricted operating conditions.

A remarkable aspect of the present invention is that improved properties can be imparted to webs and films within a treatment period which is very short. In accordance with the present invention, improved properties can be obtained by exposure to the plasma in sixty seconds, or less, frequently with treatments of less than 20 seconds, and quite satisfactorily for periods of time as little as 1.5 seconds. When sequential treatments are performed, the above-mentioned times refer to total timed exposure to the plasma.

The invention can be practiced with a variety of gases, typically inert gases like helium and argon, active gases like oxygen and nitrogen, and more complex gaseous molecules like carbon dioxide and ammonia. Gases may be used in mixtures (of two or more gases), including air, or a single gas with oxygen or some other suitable gas. Gaseous mixtures including oxygen are preferably combined in relative proportions including 2 to 20% oxygen. The gaseous mixtures may be essentially dry (i.e., essentially gaseous), or may be biphasic, such as a gas containing relatively limited proportions of a liquid (e.g., water vapor). Additional gases which may be used for appropriate applications would include hydrogen (e.g., for saturating a polymer to create a more hydrophobic surface) and some of the fluorocarbons like $CF_4$.

For further discussion of the improved methods and electrode configurations, and webs and films of this invention, reference is made to the detailed description which is provided below, taken in conjunction with the following illustrations.

BRIEF DESCRIPTION OF THE DRAWINGS

Other aspects, features, and advantages of the present invention will become more fully apparent from the following detailed description, the appended claims, and the accompanying drawings in which:

FIG. 2b is a top plan view of the electrode of FIG. 2a.

DETAILED DESCRIPTION

Figure 1:
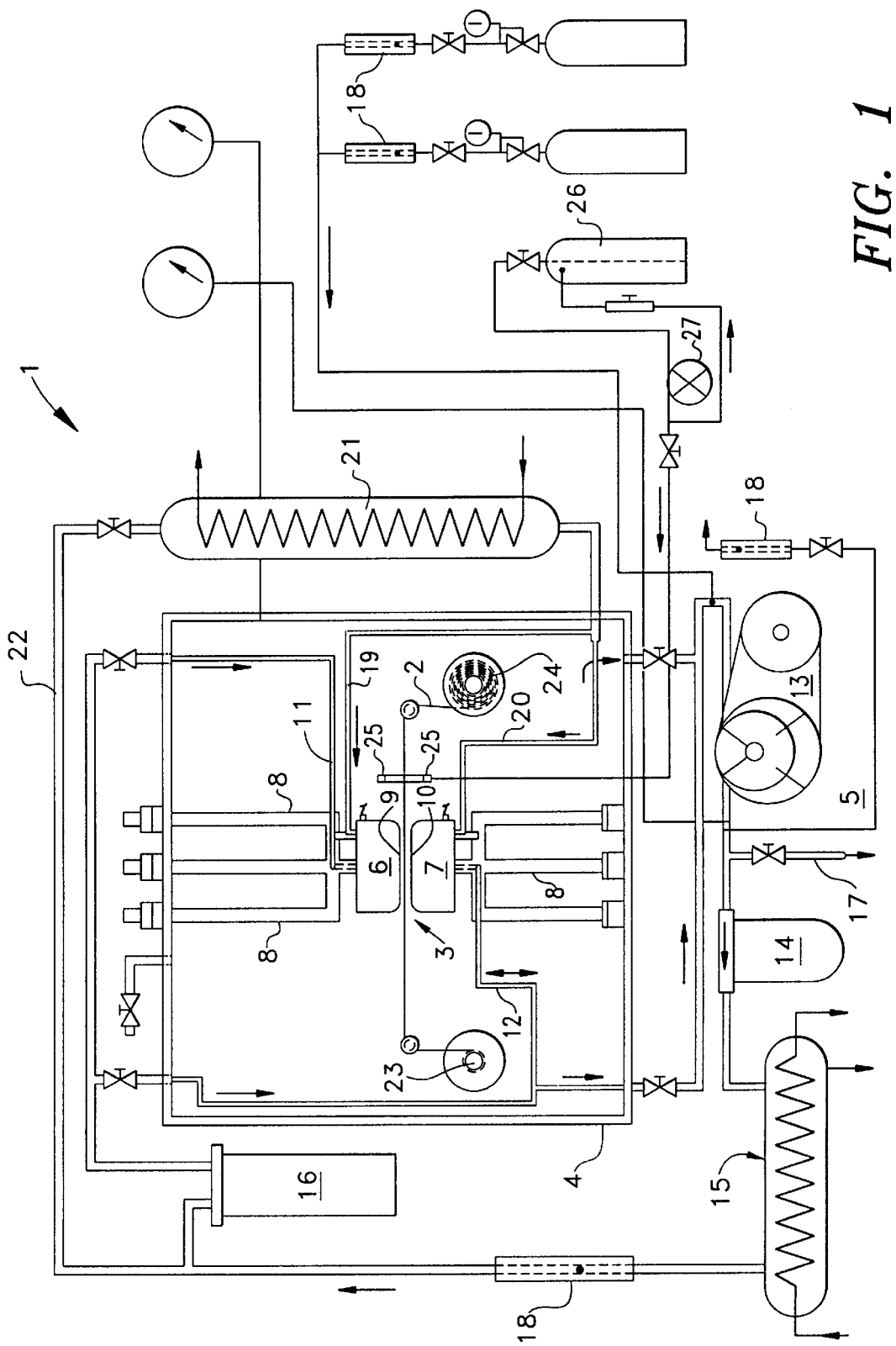
FIG. 1 is a schematic illustration of an apparatus for treating webs and films with a plasma generated at or about one atmosphere of pressure and in accordance with the present invention.

FIG. 1 generally illustrates an apparatus 1 for treating webs and films in accordance with the methods of the present invention. The apparatus 1 may be used to treat any of a variety of webs and films, primarily for purposes of enhancing their hydrophilic properties and their wettability, and also their hydrophobic or non-wetting properties, and in particular for films, to enhance printability. In addition to the more conventional polypropylene, polybutadiene webs and films, webs and films formed of polypropylene—polyethelene copolymers, poyesters, styrene copolymers, styrene butadiene, nylon 12, and others, may be treated. This can include both spunbond and meltblown webs, nonwover webs and films. The webs and films may be non-porous or porous. In the discussion which follows, such materials will generically be referred to as a "substrate" 2. The term "gas" will generally refer to a single gas or a mixture of two or more gases.

The treatment apparatus 1 is generally made up of an electrode configuration 3, a system enclosure 4 and a gas handling system 5, which are used to generate a plasma at or about one atmosphere of pressure and to expose the substrate 2 (preferably a polymer substrate) to the generated plasma. The electrode configuration 3 is made up of paired discharge electrodes 6, 7 housed within a metal enclosure and supported in position using high dielectric support rods 8. The gas handling system 5 operates to supply the electrodes 6, 7 with a temperature, humidity and flow rate regulated working gas, which in turn flows through the opposing faces 9, 10 of the electrodes 6, 7, as will be discussed more fully below. The lower electrode 7 is configured so that it can be pressurized either positively or negatively with respect to the enclosure 4. This is done to establish a flow of gas from the face 10 of the electrode 7, for the treatment of films, or a flow of gas into the electrode 7, for the treatment of porous materials.

Each of the electrodes 6, 7 receives a gas flow through a communicating manifold 11, 12. Preferably, the working gas is at least partially recycled. To this end, an oil-free compressor 13 is provided for purposes of establishing the necessary flow, and the working gas is filtered (at 14) and then chilled (at 15) to remove any moisture. A heating element 16 is provided for reheating of the working gas, which may be required depending on the operating conditions. Some of the working gas may be vented (at 17) and/or replaced with bottled supply gas (at 20), as needed, to establish an appropriately controlled flow rate. The supply and vent flow rates are usually adjusted so that the system enclosure 4 is at a slight positive pressure with respect to atmospheric pressure. Suitable flow meters 18 are provided at appropriate locations for monitoring this process.

Typical bottled supply gas flow rates are from 5 to 40 liters per minute. The gas recirculation rates will vary from 10 to 300 liters per minute. Typical gas and electrode temperatures are from 25 to 70° C., for the pulse discharge method to be described below, while colder gas and electrode temperatures are required for the resonant LC method to be described below (due to gas heating in the sheath regions). In general, the highest possible working temperature which does not allow thermal damage to the substrate, will produce the best results for hydrophilic surfaces.

Both of the electrodes 6, 7 are further supplied with a temperature controlled working fluid. For example, a glycol-water solution can be used for liquid cooling. The working gas supplied to the system can be used for gas phase electrode cooling. The desired working fluid flows through a manifold 19, 20 which communicates with an internal coil in each electrode, as will be discussed more fully below. This provides additional control of the temperature and discharge volume of the electrodes 6, 7. Temperature control is provided responsive to a heat exchanger 21 in communication with the manifolds 19, 20. Discharge volume control is provided responsive to working gas pressures developed by the gas handling system 5, through a communicating conduit 22.

The substrate 2 to be treated is conveyed through the discharge volume defined by the enclosure 4, and between the electrodes 6, 7, at a controlled rate. To this end, a supply reel 23 and a take-up reel 24 are used to treat a continuous length of material. In FIG. 1, the supply reel 23 and the take-up reel 24 are shown within the enclosure 4. It is equally possible to position a supply reel and a take-up reel outside of the enclosure 4. However, in such case, a suitably sealed entrance and exit must be provided to allow the substrate 2 to pass through the enclosure 4, and between the electrodes 6, 7.

The substrate 2 is also conveyed past a set of spray nozzles 25, which can be used to post-treat the activated surface of the substrate if desired. Such post treatment can include, for example, the application of a polar-group chemical (such as an alcohol or acetone) directly following plasma treatment to "lock" or "fix" the treated surface for improved wettability. Other post-treatments are equally useful if indicated for a particular application. In any event, a supply cylinder 26 and a supply pump 27 are provided for delivering the post-treatment medium to the spray nozzles 25.

Figure 2A:
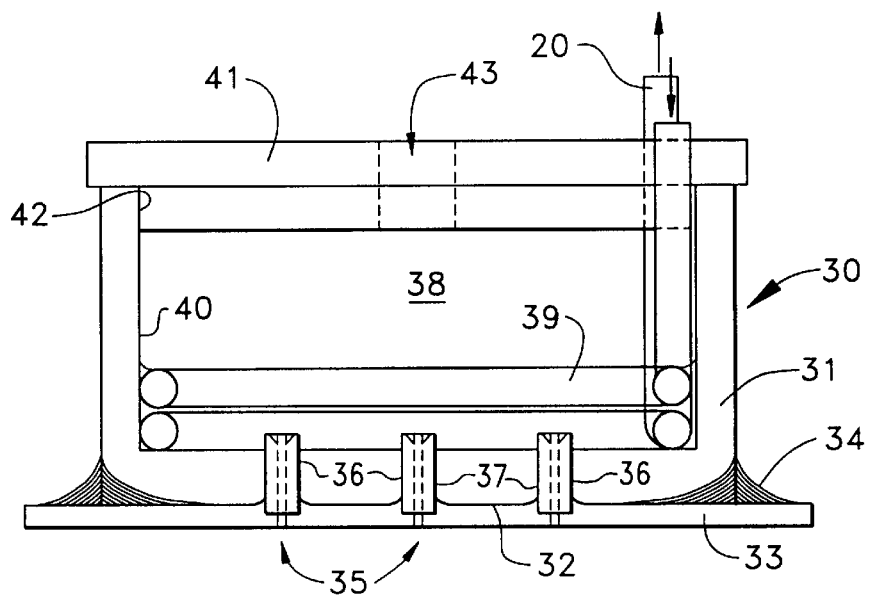
FIG. 2a is a cross-sectional view of an electrode useful in implementing the apparatus of FIG. 1, having a dielectric face.
Figure 2B:
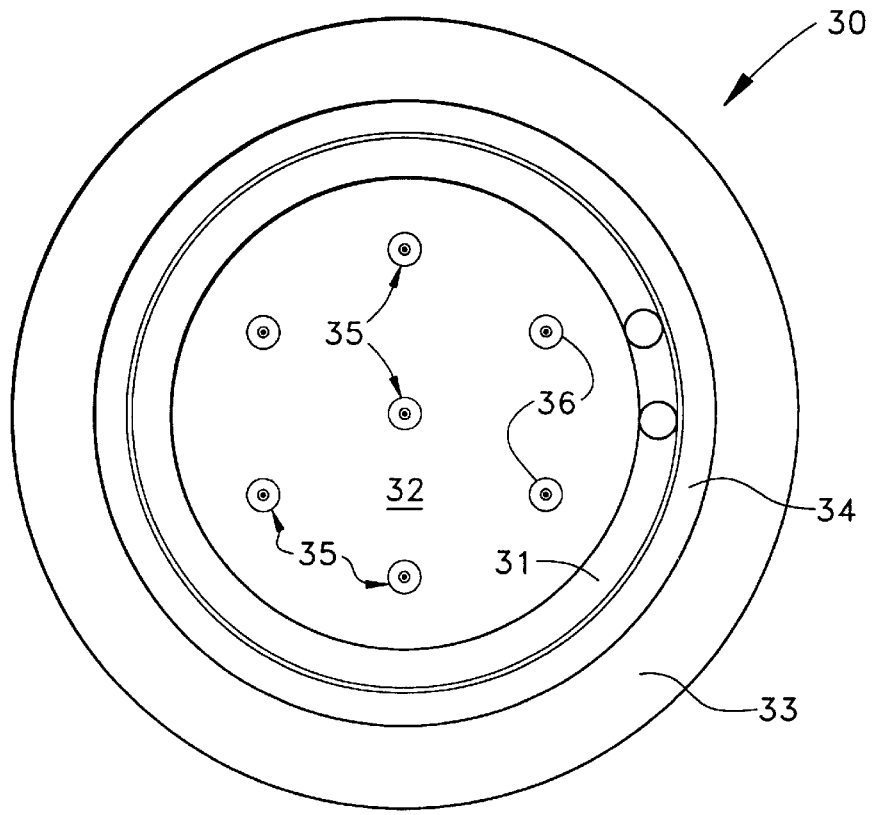

FIGS. 2a and 2b illustrate an electrode 30 (either the electrode 6 or the electrode 7 of FIG. 1) which is covered with a dielectric to reduce the potential for arcing. The electrode body 31 is preferably machined from solid stock (a metal conductor), usually formed of copper or a stainless steel The metal face 32 is machined, as shown, eventually producing a curved surface which is approximately hyperbolic in shape. The precise shape of the electrode face 32 will necessarily be determined empirically, through an interactive process involving testing of the electrode without a dielectric cover and observing where breakdown is initiated. A uniform (flat) radius can also be used, if sufficiently large, but will generally result in a poor usage of electrode body size. Uniform radii of at least 2 cm are required to minimize arcing on the electrode's edge.

A dielectric layer 33 is cemented (at 34) to the face 32 of the electrode 30, preferably using a high grade epoxy or a ceramic adhesive. Dielectric materials such as Pyrex™ glass, Vycor™ glass, Macor™ (a machinable ceramic) and Amalox 68™ (a fired alumina ceramic), have been used with satisfactory results. Dielectric thicknesses of from 3 mm to 7 mm have been used. The thickness used is governed by the material's dielectric constant, the loss factor which determines internal healing due to the electric field, the mechanical properties of thermal shock resistance, thermal conductivity, flexural strength and machinability. A low vapor pressure epoxy (Torr-Seal™) was used for mounting the dielectric layer 33 to the electrode face 32.

A radial pattern of holes 35 is machined through the face 32 of the electrode 30. Each of the holes 35 is preferably fitted with a dielectric sleeve 36, counter sunk into the back 37 of the dielectric face 32. A machinable ceramic material (such as Macor™) or alumina tubes are preferably used to form the sleeves 36. The sleeves 36 are preferably long enough so that they extend beyond the inside surface 37 of the electrode 30 by at least 3 mm. This is required to prevent arcing to the back side 37 of the electrode face 32. Small flow holes, typically number 60 to number 55, are machined through the dielectric sleeves 36 and the dielectric layer 33. The interior of the electrode 30 is further machined to form a cavity 38 which acts as a plenum so that gas flow is more evenly distributed to the outlet holes 35.

A coil network 39 is inserted into the cavity 38 and soldered to the wall 40 of the electrode 30. The coil network 39 communicates with the previously described manifolds 19, 20 (and the heat exchanger 21) to allow a temperature controlled fluid to be circulated through the coils 39 to regulate the temperature of both the electrode 30 and the working gas received in the cavity 38. A cover plate 41 is fitted to the open end 42 of the electrode 30 and acts as a gas barrier, as well as a mounting plate for the electrode 30. A gas inlet port 43 is provided in the cover plate 41 to establish communication between the cavity 38 and the manifolds 11, 12 which supply the electrodes with the working gas.

Figure 3A:
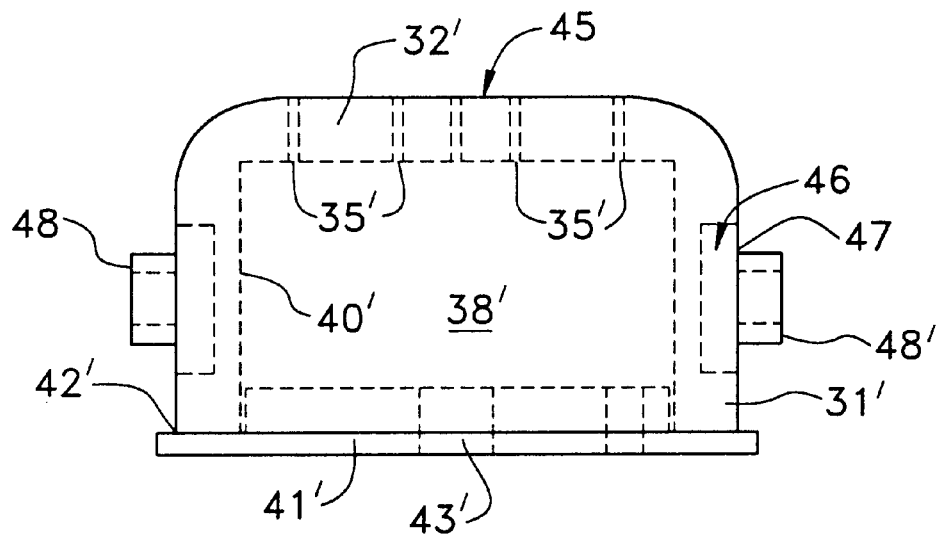
FIGS. 3a and 4a are cross-sectional views of other electrodes useful in implementing the apparatus of FIG. 1, having an exposed metal face.
Figure 3B:
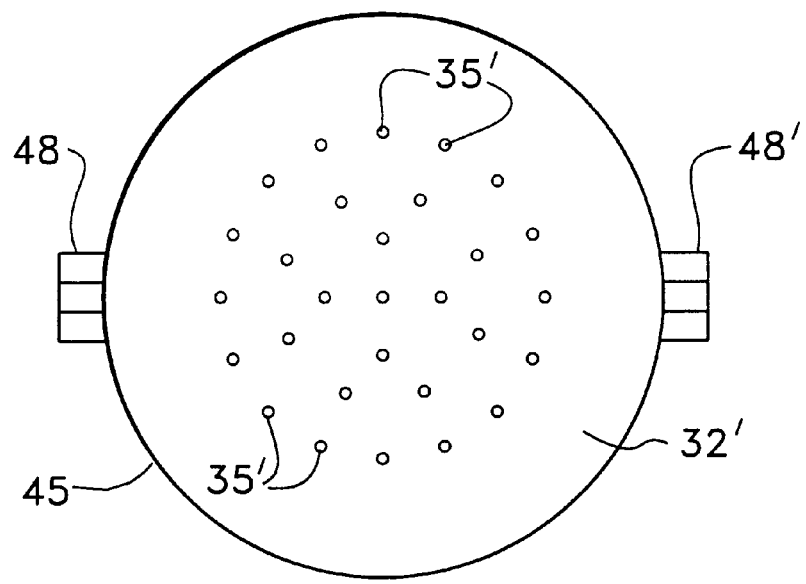
FIGS. 3b and 4b are top plan views of the electrodes of FIGS. 3a and 4a, respectively.

FIGS. 3a and 3b illustrate a metal faced electrode 45, which is used opposite the dielectric covered electrode 30 to develop the electrodes 6, 7 which make up the electrode configuration 3 of FIG. 1. The metal faced electrode 45 is machined similar to the dielectric covered electrode 30, except for the holes 35 and the associated dielectric sleeves 36. In this case, the radial hole pattern for the metal faced electrode 45 will generally have significantly more holes 35' than the dielectric covered electrode 30. The holes 35' are directly sized at a number 60 to a number 50, as opposed to the 3 to 5 mm undercuts required for receiving the dielectric sleeves 36.

Since any hole in the electrode face will locally distort the electric field, it is preferred that the total hole area (in sum) not exceed 25% of the electrode face area for the dielectric covered electrodes 30. Due to electric field distortion and the need to produce good gas mixing, the holes 35, 35' in the two electrode faces 32, 32' should be offset azimuthally and/or radially. The number of holes 35, 35' in the electrode faces 32, 32' will vary widely, depending on various parameters and conditions. As examples, as few as 7 holes (number 60) have been used for a 4 inch diameter copper electrode, while as many as 108 holes have been used for a 3.5 inch diameter brass electrode. More or fewer holes may be used for other applications.

Figure 4A:
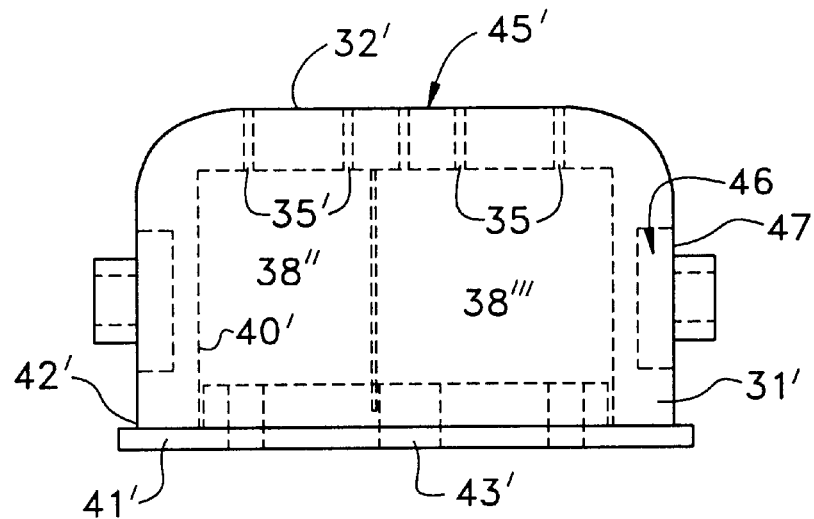

FIG. 4a further illustrates an alternative temperature regulating arrangement for the electrodes of the present invention, which is equally applicable to the dielectric covered electrodes 30 and lo the metal faced electrodes 45. In this case, the wall 40' of the electrode 45 is machined to develop a stepped recess 46. The recess 46 is in turn jacketed with a sleeve 47. Inlet and outlet connections 48, 48', respectively, are provided to establish an appropriate fluid flow. Such an arrangement is more suitable for electrode bodies formed from aluminum and stainless steel. Use of the coils 39 for purposes of temperature regulation is more suitable for electrode bodies formed from copper or brass.

The working gas introduced into the electrodes 30, 45 is typically at 250 to 500 torr above atmospheric pressure, with a flow rate of approximately 10 to 200 liters per minute for a 10 cm (diameter) electrode. The flow rate will vary depending on the type of gas used and the discharge technique employed. The pulse discharge technique which will be discussed more fully below will typically use high flow rates to delay and disrupt the formation of a filamentary discharge. Such flow rates produce a Reynolds number in the range of from 1,000 to 100,000 (in a flow hole). Hence, the flow is typically very turbulent at the hole opening and into the discharge region. This turbulent flow allows improved temperature control of the gas phase, and of the substrate, as well as a rapid removal of etched products. When used to treat porous materials, the lower electrode (the electrode 7 of FIG. 1) is used as a gas return to draw flow through the substrate material. For the treatment of polymer films, a positive flow through both electrodes is used to keep the film suspended between the electrodes, eliminating the problem of film-to-electrode adhesion.

Figure 4B:
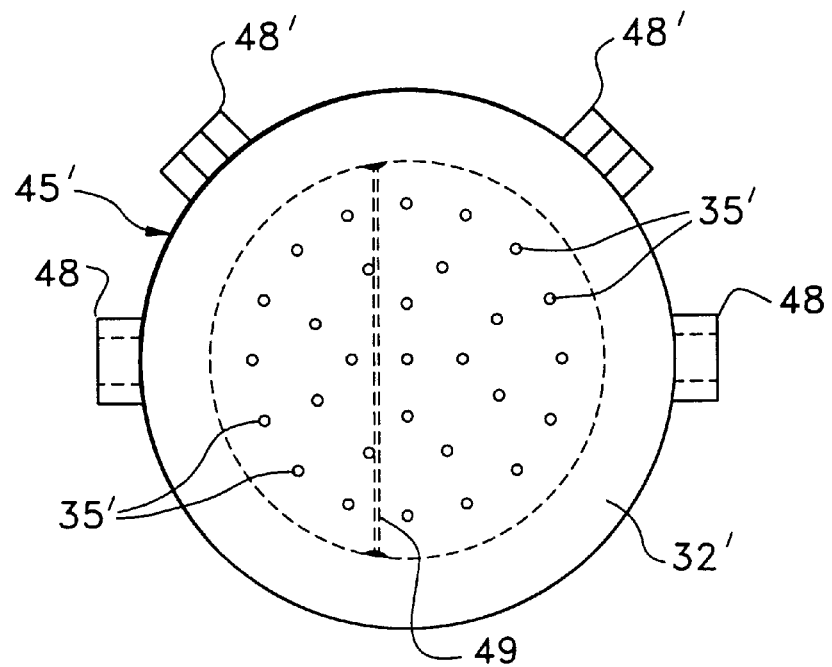

FIGS. 4a and 4b illustrate an electrode 45', the structure of which substantially corresponds to the structure of the electrode 45 of FIGS. 3a and 3b except for the addition of a partition wall 49. The partition wall 49 is placed within the electrode cavity 38' to partition the cavity and allow two separate gas mixtures to be used simultaneously. As an example, and for reasons which will be discussed more fully below, a first gas can be introduced into the cavity partition 38", for exposing the substrate 2 to a first active species, while a second gas is introduced into the cavity partition 38'", for exposing the substrate 2 to a second active species. In this way, the substrate 2 can be subjected to varying treatments. A similar result can also be obtained with two separate pairs of electrodes (the electrodes 30 or the electrodes 45), supplied with different gases for exposing the substrate 2 to different active species as the substrate 2 is conveyed through the resulting electrode configuration.

Figure 5A:
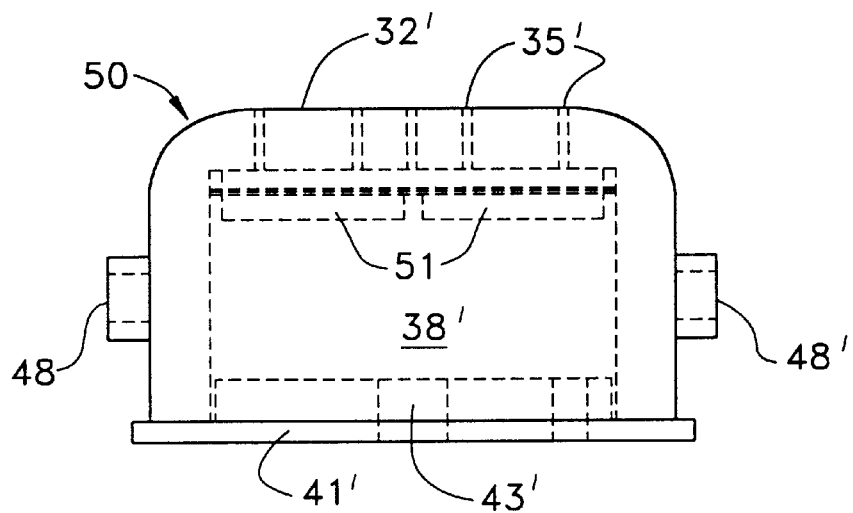
FIGS. 5a and 5c are cross-sectional views of alternative embodiment electrodes that are capable of operating with an applied magnetic field.
Figure 5B:
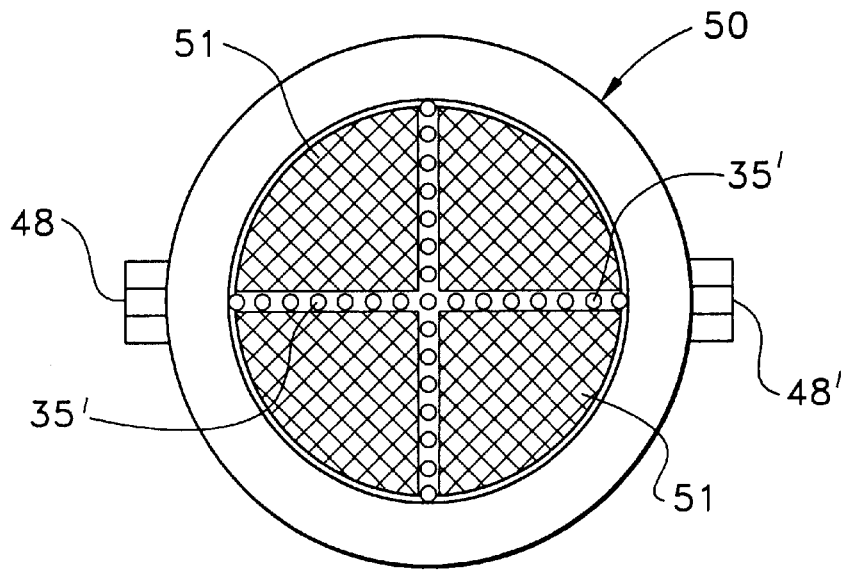
FIGS. 5b and 5d are top plan views of the electrodes of FIGS. 5a and 5c, respectively.

The electrodes 30, 45 are also capable of operating with an applied magnetic field. FIGS. 5a through 5d illustrate two implementations 50, 50' of the previously described electrode designs with a magnetic field. In FIGS. 5a and 5b, the applied magnetic field is developed by permanent magnets 51 mounted inside (one or both of) the electrodes. The developed field is essentially perpendicular to the face 32' of the electrode 50, and serves multiple functions. For example, the developed field tends to confine charged particles to the plasma discharge region. The developed field further interacts with the radial electric field produced by the shaped outlets of the gas flow holes 35' (in the metal faced electrode). The radial electric field produced locally by a flow hole, coupled with the axial magnetic field, will produce an E×B azimuthal force on charged particles, resulting in particle heating.

The presence of a magnetic field also acts to improve the treatment of web materials. To this end, thermalized ions will tend to spiral along magnetic field lines, with azimuthal velocity components and a linear velocity component along the magnetic field lines. The azimuthal velocity components due to the imposed magnetic field will improve the exposure of individual web fibers. By using a magnetic field intensity adequate to produce an ion gyro-radius comparable to the fiber spacings in a web, a greater exposure of the fiber surface to active ion species can be achieved. Magnetic fields of a few hundred gauss are typically required for this.

In the foregoing discussion the permanent magnets are oriented with the same polarity positioned toward the electrode face 32' (either north or south). The magnets can also be used with alternating polarity. This produces some regions of magnetic field perpendicular to the dominant electric field, which is perpendicular to the electrode face. Mounting of the magnets is facilitated with this arrangement, since field lines on the backside of the magnets can be connected using a suitable ferromagnetic metal (i.e., soft iron). This will tend to better hold the magnets in position.

Figure 5C:
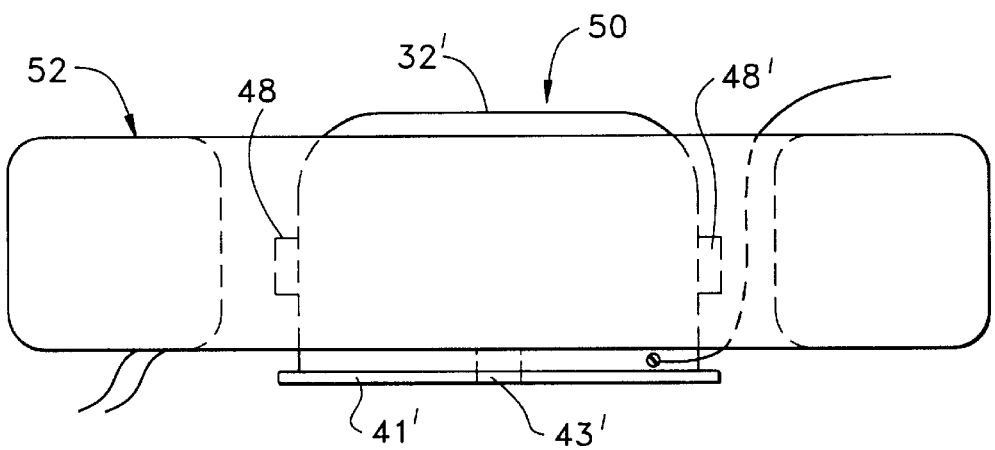
Figure 5D:
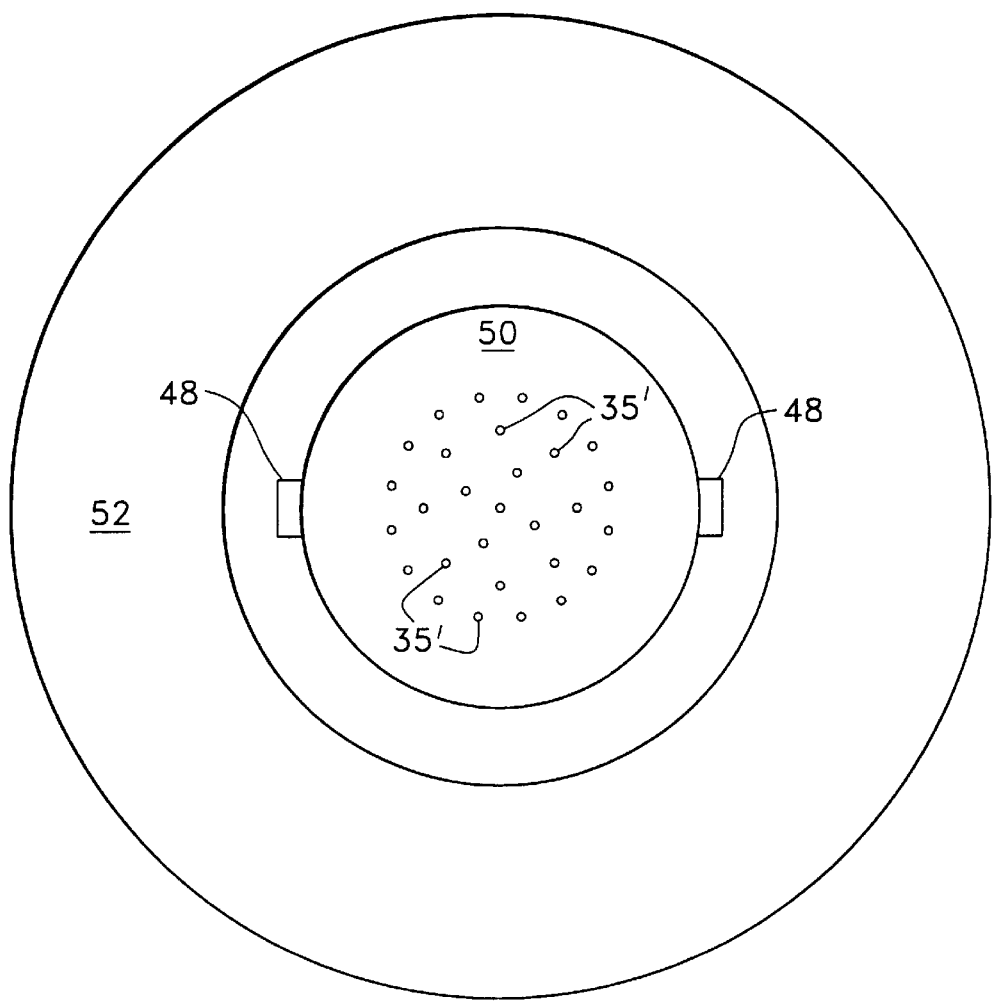

In FIGS. 5c and 5d, the applied magnetic field is developed by an electromagnet 52 mounted external to (one or both of) the electrodes. The electromagnet 52 surrounds the electrode 50', and is electrically isolated from the electrode. The electrical connection with the electromagnet 52 is routed so that the connection does not complete a current loop with the magnet coil. The large inductance of the magnet coil would ordinarily tend to degrade the high frequency response of the electrical circuit used to operate the electrode 50'. The magnet coil is designed so that it can be energized with either a direct current or a low frequency sinusoidal current (typically 60 Hz). The use of a modulated magnetic field produces a range of ion gyro-radii for ions penetrating into a web substrate.

Figure 6:
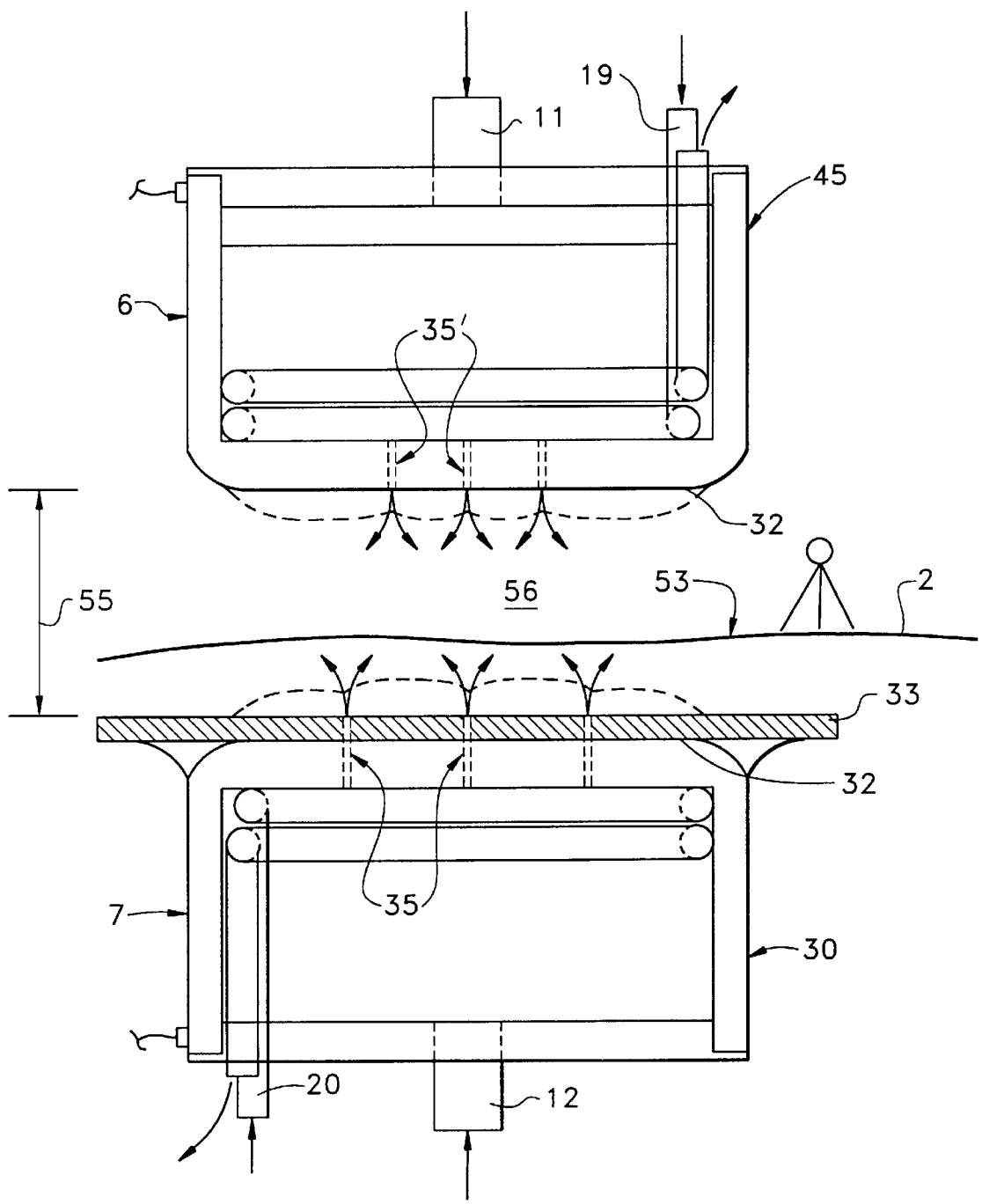
FIG. 6 is a cross-sectional view illustrating operation of the electrode of FIG. 2a and the electrode of FIG. 3a in combination.

FIG. 6 schematically illustrates two opposing electrodes (e.g., the electrodes 6, 7 of FIG. 1) and a polymer substrate 2 which is being plasma treated. The discharge gap 55 (typical spacings of from 0.6 mm to 10 mm have been used) is enlarged for purposes of illustration. In this case, the gas flow is configured for treating a film material, as previously described, and keeps the film suspended between the electrodes 6, 7 to prevent adhesion to either of the electrode faces 32, 32'. As shown, the upper electrode 45 is biased negatively relative to the lower electrode 30, to drive negative species of the plasma into the top surface 53 of the substrate 2. These species will interact with the substrate 2 and produce volatile products which can be redeposited and contaminate the working gas in the discharge volume (at 56). Gas flow through the faces 32, 32' of the electrodes 30, 45 reduces these effects.

Ion bombardment and ultraviolet (UV) irradiation of the metal faced electrode 45 will produce secondary electrons and photo-emitted electrons. These electrons are important in sustaining a high pressure discharge. Electronegative gases such as oxygen and carbon dioxide have very high attachment rates for electrons and tend to extinguish the plasma.

Ultraviolet irradiation and ion bombardment of a polymer substrate will result in bond dissociation and substrate etching. The polymer chain can cross link or react with the active species present in the discharge zone to produce a modified surface. The processes of etching and bond dissociation are necessary for the surface modification of a substrate, but they are also competing processes for the production of a modified substrate with new species attached to the polymer chain. UV and ions of sufficient energy to cause bond dissociation and etching of the polymer chain will also cause bond dissociation and etching of the modified polymer chain. Hence, some equilibrium is reached for a given gas mixture and discharge conditions, and a modified polymer substrate is produced.

Control of the discharge current-voltage characteristics, gas flow, gas temperature and gas mixture can improve the production of the modified polymer substrate. However, a given plasma will always tend to have competing processes for polymer surface modification. A two step process which can be used to partially solve this problem is to first expose the substrate to a discharge plasma having strong UV and/or etching properties, activating the substrate surface, and to then expose the substrate to a plasma with high concentrations of active species suitable for reactions with the activated polymer surface. Partitioned electrodes 45' such as are illustrated in FIGS. 4a and 4b, using two different gas mixtures appropriate to each step of this two step process, are useful in implementing such a treatment. As previously indicated, two separate paired electrode configurations are also useful in implementing such a treatment, if desired.

Figure 7:
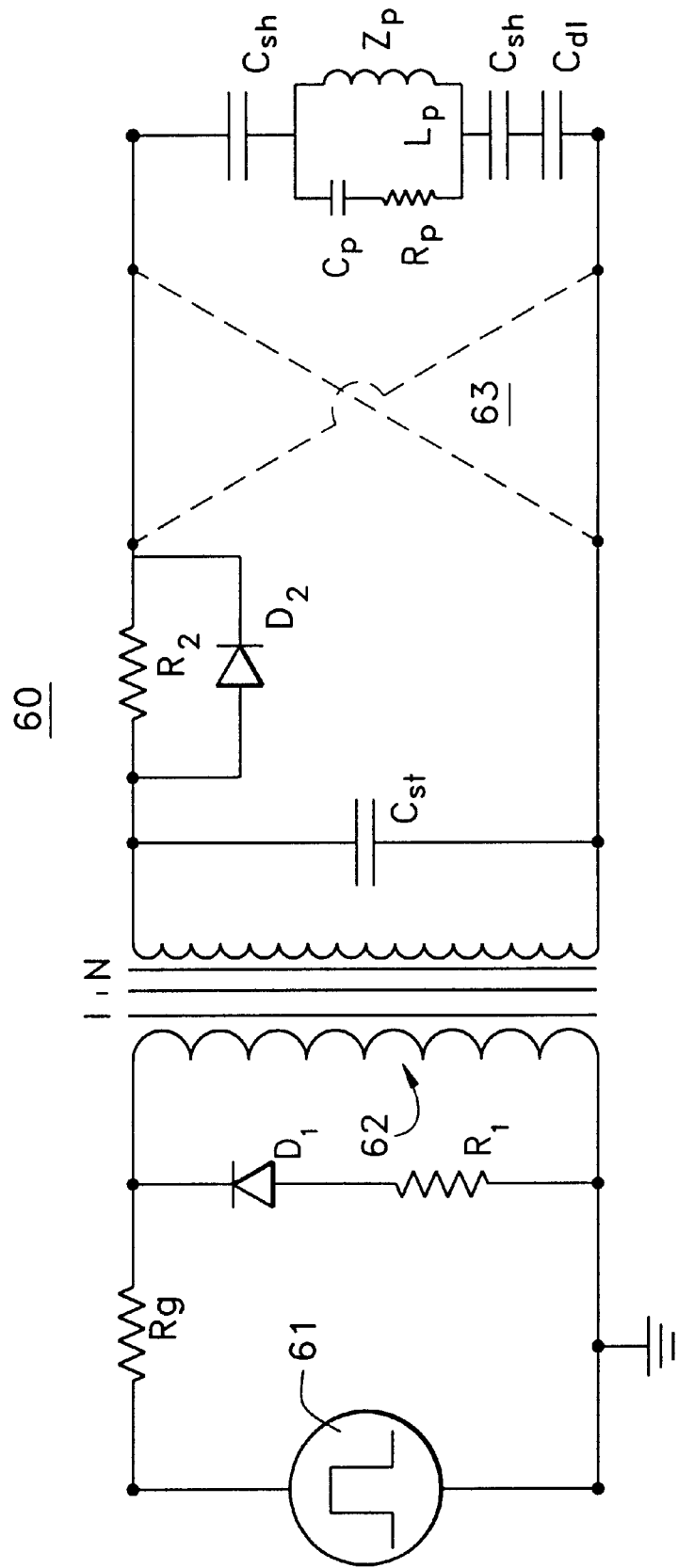
FIG. 7 is a schematic diagram of a first circuit for exciting the electrodes of FIG. 6.

One method which is useful in exciting the previously described electrodes (30, 45) is to employ a pulse discharge circuit including a pulse generator, pulse transformer and high voltage diodes to generate a one atmosphere plasma between the two shaped electrodes. FIG. 7 illustrates one such arrangement of these components, to form a pulse discharge network 60. A high voltage pulse generator 61 (e.g., a Velonex Model 570 or equivalent) is used to develop a pulse having an amplitude of at least 1 kv, a variable pulse width of 1 to 20 microseconds, and a variable pulse repetition frequency of 1 to 100 kHz. Peak pulse power is on the order of 20 kw, with an average power of 200 watts or more. To increase the output voltage of the pulse generator 61, and to better match the generator impedance $R_g$ ($R_g$ is 200 ohms for the Velonex Model 570) to the plasma load $Z_p$, a step-up voltage transformer 62 is used. Transformer turns ratios of 1:2 to 1:7 are typically used, depending on the working gas and the electrode geometry and spacing. The use of electronegative gases such as oxygen and carbon dioxide requires higher voltages, and hence, a higher turns ratio than the use of strictly inert gases such as helium or argon. When the pulse source is charge limited for a given electrode size and voltage, the use of a smaller diameter electrode will allow higher voltages to be obtained (and the use of a higher turns ratio transformer).

Since the discharge electrodes represent a high capacitance load (the sum of $2 \times C_{sh} + C_{di}$), the diodes D1, D2 and the corresponding resistors R1, R2 are additionally used to control the voltage waveform and current flow. The diode D1 and the series resistor R1 act as a voltage clipping network to reduce the amplitude of the "kick-back" voltage produced during the fall of the generator pulse. This voltage is due to energy storage in the mutual inductance (coupling) between the primary and secondary windings of the step-up transformer 62.

The positive (or negative) pulse from the generator 61 also causes charge to be displaced across the discharge electrodes, resulting in a large electric field across the discharge gap (i.e., the gap 55 of FIG. 6) and breakdown of the working gas. When the pulse is terminated or can no longer be sustained, this displaced charge will tend toward equilibrium, and will appear as a sudden reverse current and voltage spike. The second diode D2, and the resistor R2 in shunt with the diode D2, act to slow this reverse current and decrease the resulting voltage spike.

The combination of the diodes D1, D2 and the resistors R1, R2 helps to produce a discharge that is predominately positively biased (or negatively, depending on the lead connections at 63), for a polymer substrate 2. Paired comparison tests of this method on a polymer film treated in a carbon dioxide plasma have verified the utility of using this asymmetric voltage pulse to excite a discharge. For example, a polyethylene-polypropylene copolymer treated with a carbon dioxide oxygen plasma had better wettability with a negatively biased upper electrode than with a positively biased upper electrode.

The power delivered to the plasma discharge load $Z_p$ must be coupled across the combined capacitances $C_{di}$ and $C_{sh}$, where $C_{di}$ is due to the dielectric barrier and $C_{sh}$ due to the plasma sheaths that form on the face of each electrode. These capacitances tends to limit the current that can be delivered to the load $Z_p$ for a given voltage. Increasing $C_{di}$, e.g., by using a dielectric barrier with a high dielectric constant, will increase the discharge current (and power) to the load $Z_p$. The sheath capacitance $C_{sh}$ can be partially controlled with the gas flow established at the electrode faces. The impedance $Z_p$ is often modeled as a three component network including an inductance $L_p$ in parallel with a capacitance $C_p$ and a resistance $R_p$. At high pressures, the plasma capacitance $C_p$ becomes large, making the discharge predominately capacitive.

Figure 8A:
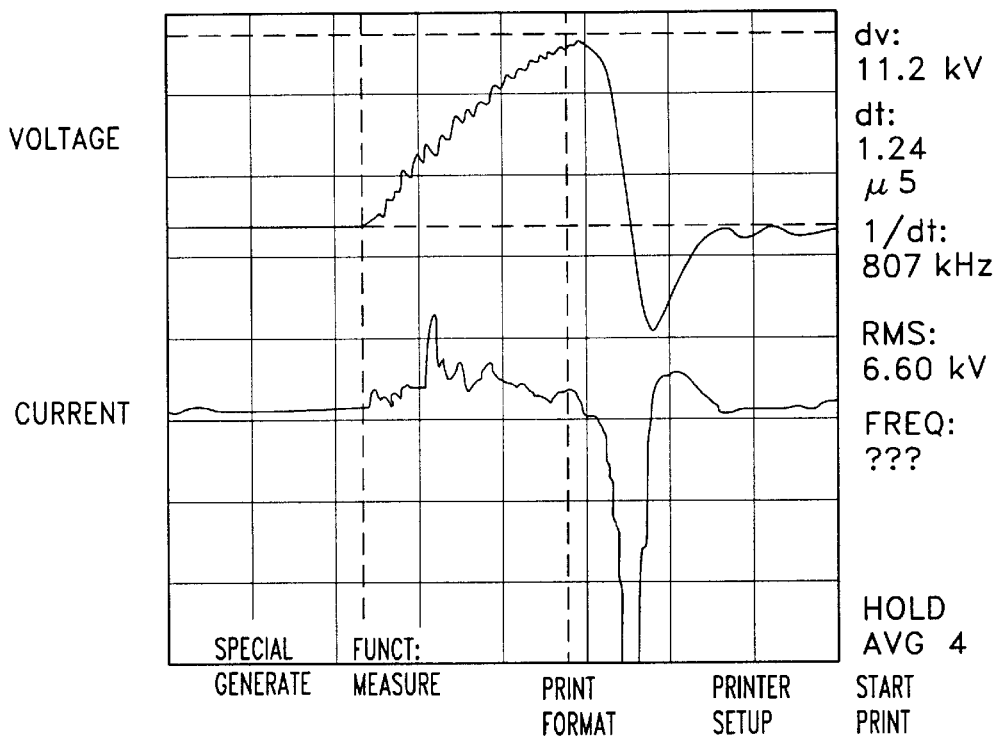
FIGS. 8a and 8b are graphs showing typical voltage and current waveforms resulting from operations of the circuit of FIG. 7.
Figure 8B:
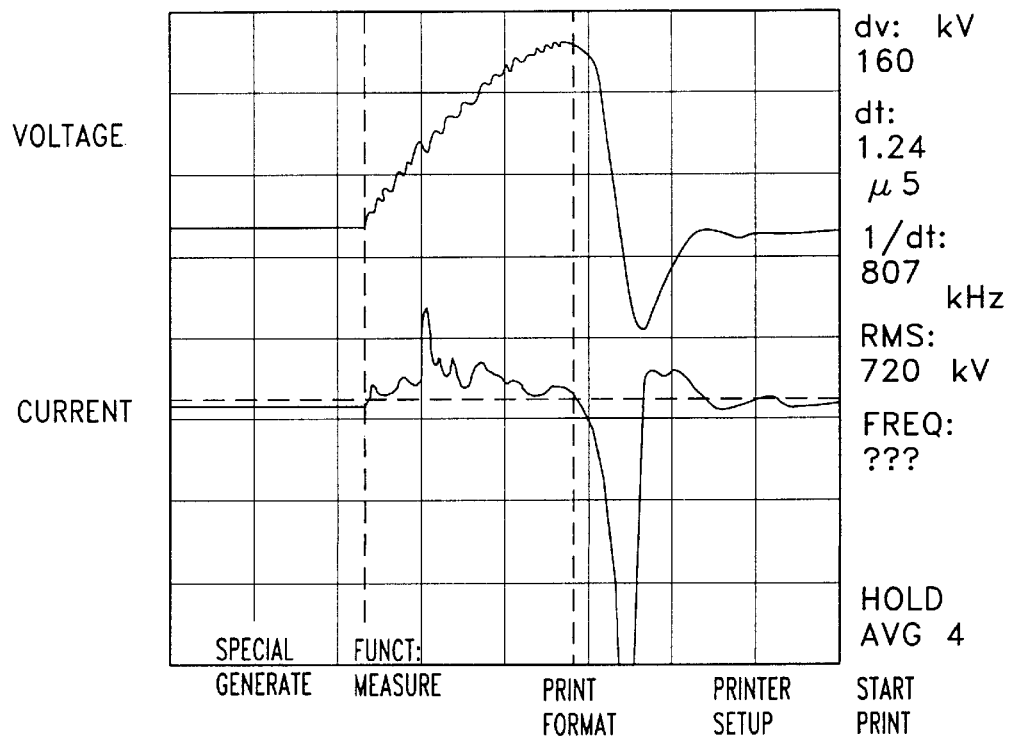

FIGS. 8a and 8b illustrate current and voltage waveforms for a single pulse of a 10 kHz pulse repetition rate signal (the illustrated waveforms are inverted since a negative pulse was used). Such a signal can produce a plasma discharge in carbon dioxide, oxygen and helium gas mixtures. Plasma power densities on the order of 10.6 watts/cm$^3$ are obtained. The resulting plasmas have been used to treat spunbond polypropylene samples for treatment times of 15, 8 and 5 seconds, respectively. Each of the samples were made wettable to water as a result.

In each case illustrated (FIGS. 8a and 8b), the voltage rise time was 1.25 microseconds, during which current flowed to the electrodes. The actual discharge was ignited at about 5 kv, where a small spike occurs in the current waveforn. At the pulse termination, a fall time of about 250 nanoseconds was observed, and a 6 kv inverted voltage pulse of 500 nanoseconds was observed. This pulse would be approximately twice as large without the diode D1 and resistor R1 of FIG. 7. A current pulse also occurs during this period. Since charge is conserved, the area of this inverted pulse waveform will be equal to the area of the initial current pulse during the rise in voltage.

A pulse generator 61 having a fast rise time, with a properly designed pulse transformer 62 (matching $R_g$ to $Z_p$), will also increase the discharge current. Using the Velonex Model 570 pulse generator mentioned earlier, and a 1:5 toroidal wound pulse transformer, a 15 kv pulse has been produced with a rise time of less than 1 microsecond. Plasma power densities of 6 to 20 watts/cm$^3$ were produced. These discharge power densities have been used to treat polymer films and polypropylene spunbond fabrics with treatment times as short as 5 seconds.

The stray capacitance $C_{st}$ of FIG. 7 is due to support rods, connecting tubes, and the proximity of high voltage surfaces to grounded conductors, and should be minimized. This capacitance requires increased supply current in order to produce a given voltage across the electrodes. For this reason, the electrodes are preferably supported by high dielectric insulating rods and are temperature controlled using a gas phase cycle, or a liquid cycle with a sufficiently long coolant path.

Another method which is useful in exciting the electrodes (30, 45) previously described is to employ a tuned or resonant circuit, developed by connecting an inductor in parallel with the pair of discharge electrodes. The shunt inductor will be placed in parallel with the sheath capacitance formed on the face of each electrode and the plasma capacitance formed by the discharge. At and near resonance, this circuit will have a high impedance which is predominately real. This allows a high voltage to be generated across the circuit, and the breakdown of a working gas between the discharge electrodes. A large recirculating current will flow through the plasma and shunt inductor. This current will increase the power that can be dissipated by the discharge plasma and provide stability. The recirculating current will also enhance the electron population generated by secondary emissions from the faces of metal electrodes. These secondary electrons, as well as electrons due to UV photoemission, play an important role in sustaining a high pressure radio frequency (RF) discharge operating in gases such as oxygen and carbon dioxide, which have high electron attachment rates.

Figure 9:
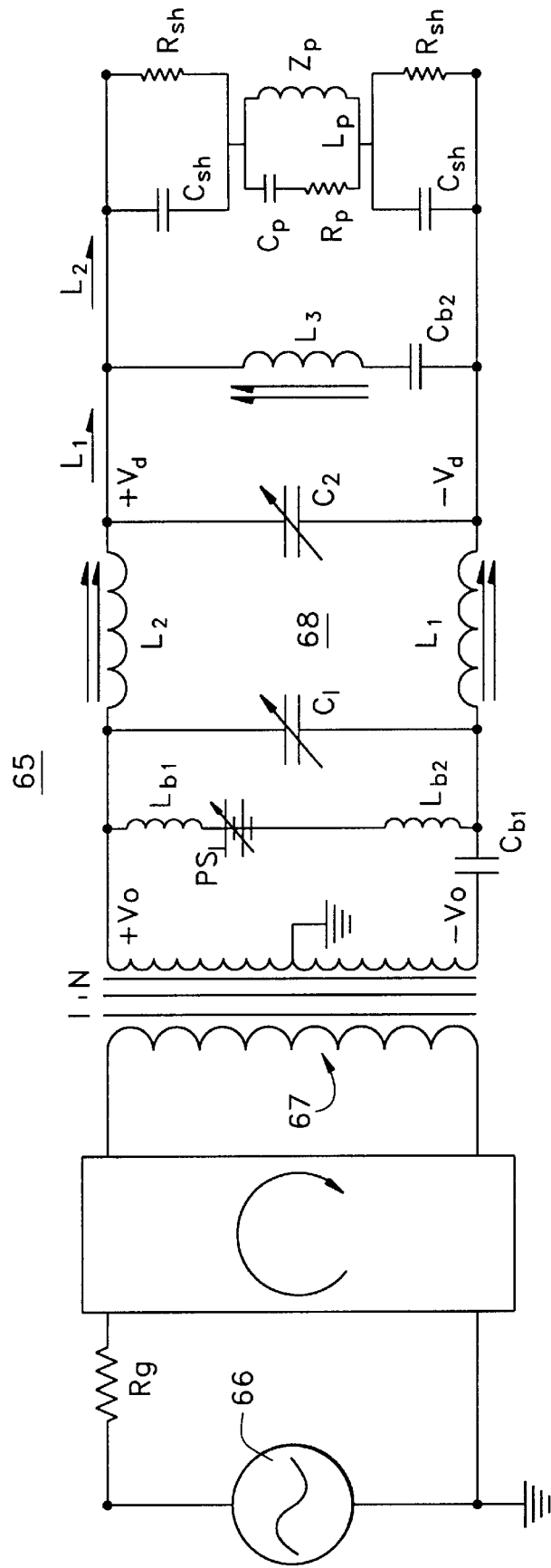
FIG. 9 is a schematic diagram of a second circuit for exciting the electrodes of FIG. 6.

FIG. 9 illustrates one such arrangement, showing a preferred network 65 (and its components) for exciting a uniform plasma between two of the previously described shaped electrodes. The bulk plasma is modeled as an inductance $L_p$ in parallel with a capacitance $C_p$ and a resistance $R_p$. Under suitable vacuum conditions, the plasma can be operated as self-resonant due to the parallel combination of $L_p$ and $C_p$. A high power, radio frequency (RF) source 66 is used to provide at least 1 kw of RF power at 1 to 30 MHz. Tested systems have been operated at 13.56 MHz and 2.2 kw. However, the network will, in practice, operate over the entire band of 1 to 30 MHz. The unbalanced (50 ohm) output of the generator 66 is converted to a balanced output voltage using an impedance transformer 67 having an impedance ratio of 1:1 to 1:9.

The transformer 67 (the voltage) is coupled to a symmetric "pi" matching network 68 with variable capacitors C1 and C2, and variable inductors L1 and L2. For this arrangement, the capacitors C1 and C2 are variable, preferably over a range of from 20 to 450 pf for C1 and from 10 to 200 pf for C2. The inductors L1 and L2 have the same number of turns, and are preferably variable over a range of from 2.5 to 5 $\mu$H. The network 68 is tuned to match the output impedance of the transformer 67 to the impedance of the resonant circuit formed by the shunt inductance $L_s$ and the sheath capacitances $C_{sh}$, $C_{sh}$ in series with the plasma capacitance $C_p$. The series resistance $R_p$ is the discharge impedance due to plasma ionization and heating, UV emission, particle loss, and neutral gas heating. The capacitance $C_p$ formed when a plasma is present is not the same as the free space gap capacitance formed by the two electrodes. Hence, a retuning process is required as the plasma is initiated. Retuning is first initiated by adjusting the variable inductor $L_s$ to reduce the power reflected to the generator source. The pi matching network is then tuned to improve the match between the generator and plasma load. Repeating this procedure can produce a match with 10% or less reflected power.

A balanced pi network is used so that a push-pull current is driven across the discharge electrodes. An equivalent "tee" matching network can also be used to achieve an equivalent result. However, a pi network is preferably used because it is somewhat easier to assemble experimentally. In practice, the inductors L1 and L2 must be carefully tuned so that the voltages +$V_d$ and -$V_d$ are 180 degrees out of phase. At and near resonance, large currents will flow through the inductor $L_s$ and the discharge. This recirculating current is typically 3 to 10 times the supply current. Hence, the "Q" of the resonant circuit is typically 3 to 10. The discharge and pi network should therefore be adequately shielded and good high voltage RF techniques observed. The use of a balanced pi matching network allows some independent control of the voltage-current relation of the discharge. This relation is normally fixed by the impedance of the load, or plasma parameters in this case. Since C2 is in parallel with $L_g$ and the discharge, tuning and detuning of the circuit's resonant frequency is direct, and allows the forward power delivered to the plasma to be varied.

For use with the metal faced electrodes 45, the network 65 is preferably equipped with a DC power supply PS1, for electrode biasing. Blocking inductors Lb1 and Lb2 are installed to isolate the DC power supply PS1 from high voltage RF. Typically, the inductors Lb1 and Lb2 are 50 $\mu$H, ot larger. Two blocking capacitors, Cb1 and Cb2, must also be used (typically 1000 pf) to prevent the DC power supply PS1 from shorting through the inductor $L_s$ and the RF transformer 67.

This discharge technique will not only operate with the paired electrodes 30, 45 discussed earlier, but also with two metal faced electrodes 45. The use of two metal faced electrodes 45 is desirable for several reasons. First, this allows a closer electrode spacing for higher electric fields. Second, this allows a DC voltage bias to be applied, increasing the flux of a given ion species to the substrate. Third, the metal faced electrodes 45 provide high reflectance surfaces to any UV radiation generated in the plasma. A metal surface with a high photoelectric emission such as copper or gold will also provide additional electrons. These electrons will assist in maintaining a plasma in electronegative gases.

Figure 10A:
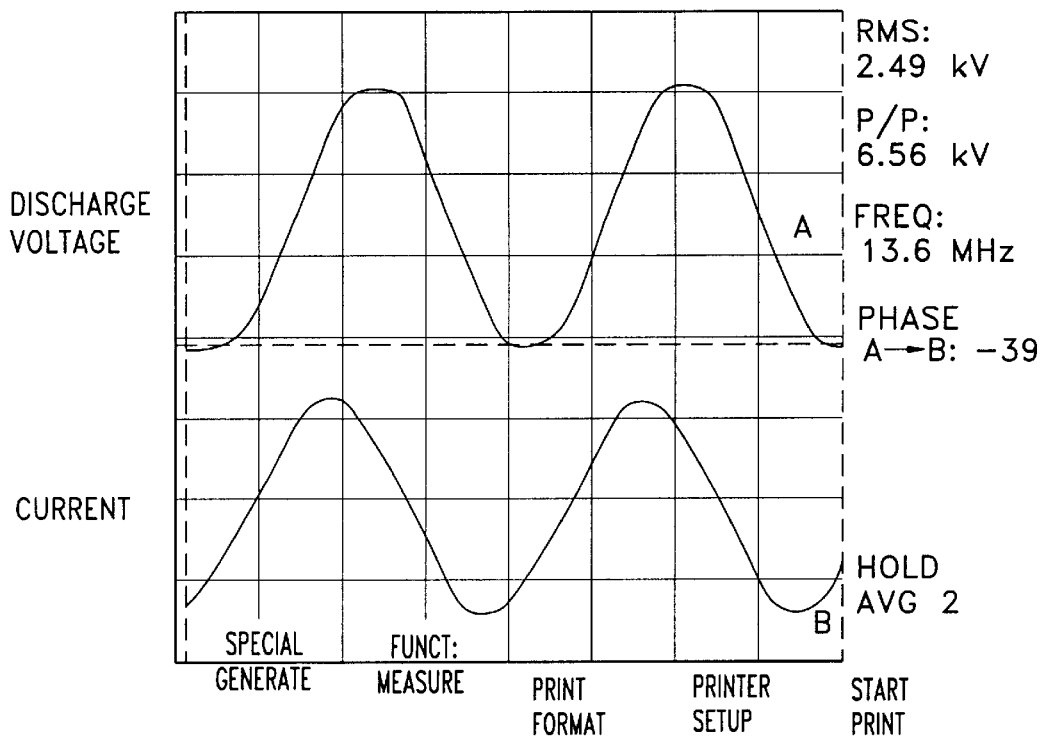
FIGS. 10a and 10b are graphs showing typical voltage, current and photoemission waveforms resulting from operations of the circuit of FIG. 9.
Figure 10B:
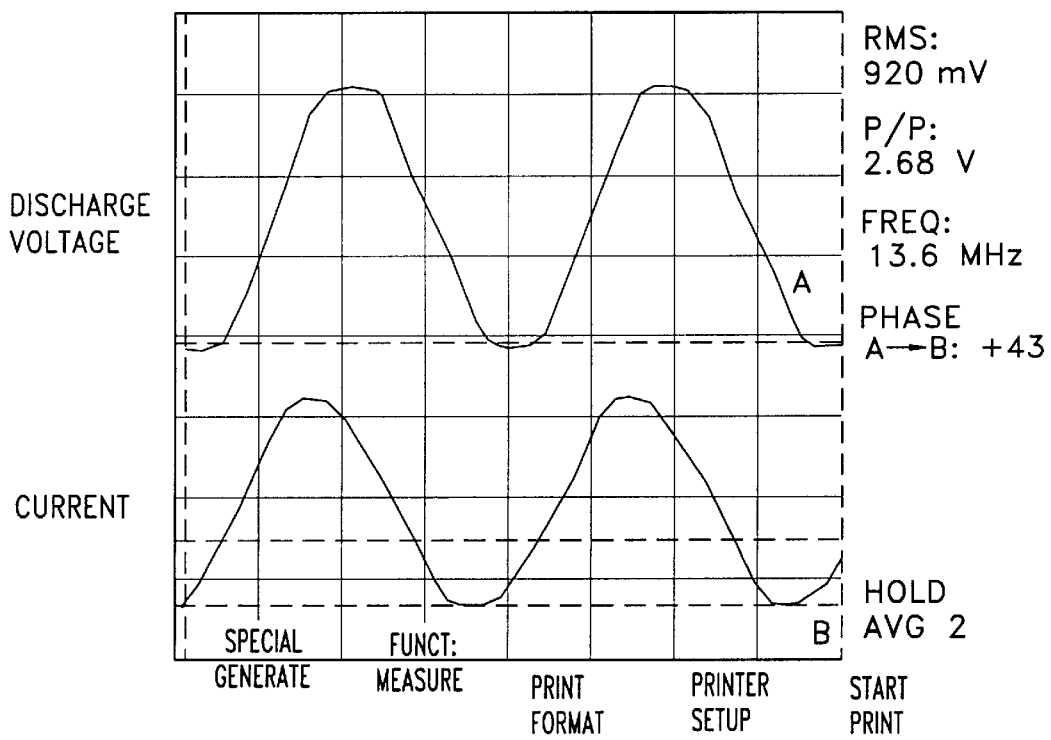

FIGS. 10a and 10b illustrate voltage and current waveforms typical for a resonant discharge using helium, oxygen and nitrogen gases, with a dielectric covered electrode 30. The measured voltage is one-half the discharge voltage since it is measured with respect to ground. The generation of a second harmonic is apparent at the peak of the voltage waveform. The measured current is the supply current (for the circuit of FIG. 9). The forward power delivered to the pi network was 1200 watts and the reflected power was 400 watts, yielding a discharge power of approximately 800 watts.

FIG. 10c illustrates the voltage waveform for a resonant discharge (the discharge of FIG. 10a for the circuit of FIG. 9), and the voltage output of a photomultiplier tube viewing the plasma. This shows the plasma light output to be uniformly modulated at twice the generator frequency. Since this signal is a continuous waveform, absent of flat or zero voltage regions, the discharge is sustained continuously. The low frequency (1–10 kHz) dielectric barrier discharge will actually turn off many times during a voltage cycle. Operating at high frequencies (1 to 30 MHz), the resonant discharge has energy continuously supplied to the plasma at a rate fast enough to prevent plasma extinction, approaching a true glow discharge.

Because of the high frequency and resonant circuit design, much higher power densities are possible than with low frequency dielectric barrier discharge methods. Using the 13.56 MHz source mentioned earlier, a 1.2 kw discharge has been excited in a helium-oxygen plasma to produce a plasma with a power density of 50 watts/cm$^3$. This power density is over one hundred times higher than power densities measured elsewhere. Due to the level of gas heating which occurs in the plasma sheaths of a resonant LC discharge, the treatment of spunbond webs and films is preferred to the treatment of relatively thick meltblown materials. Spunbond materials and films tend to be better positioned within the discharge gap.

The electrode configurations illustrated in FIG. 1 and FIG. 6 are suited primarily for the continuous treatement of a nonconducting pliable material, preferably in the form of a web, film, sheet, yarn or filament. However, since the treated material can occupy as little as 10% of the discharge volume (for a film) to as much as 85% of the discharge volume (for a meltblown web), a considerable range of material thickness and types can be treated in accordance with the present invention. Web types of spunbond, meltblown, hydroentangled, carded, needle punched and composite, layered or laminated materials can be treated, and their surface characteristics improved. Smooth or textured films can also be treated.

The discharge techniques mentioned above, coupled with electrodes having controlled temperature and gas flow, allow a variety of different gases to be used, and hence, a broad range of synthetic and natural polymer materials to be treated. The vinyl polymers, polyethylene, polypropylene and polystyrene can be treated. Webs or films of polyester, polyethylene terephthalate (PET), and polybutylene terephthalate (PBT), as well as nylons, silicones and polycarbonates (Lexan), are well suited for treatement. Natural materials such as cotton, wool, leather and paper can also be treated in accordance with the present invention, either as such or as components of laminates, composites or of other materials to be treated.

Figure 11A:
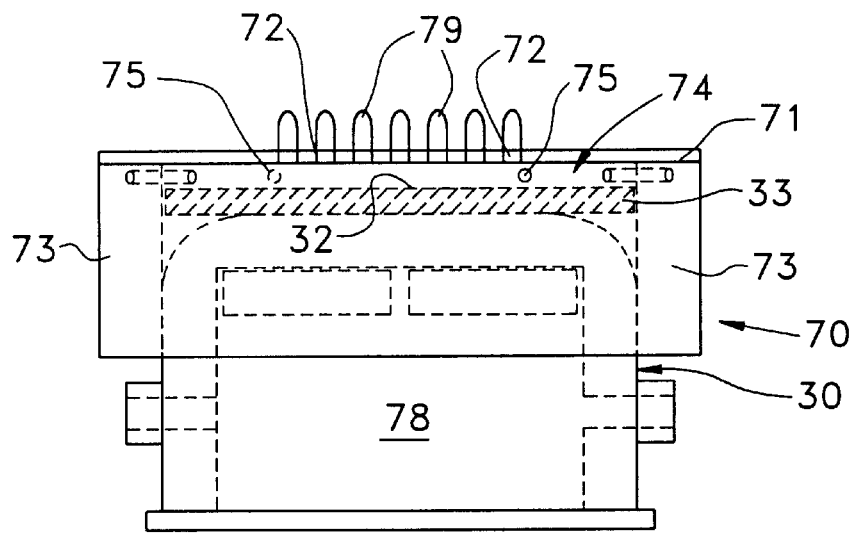
FIGS. 11a and 11b shows two views of an electrode configuration useful in producing a plasma for the treatment of three-dimensional objects, the upper view of which is a cross-sectional view of the electrode configuration and the bottom view of which is a top plan view of the electrode configuration.
Figure 11B:
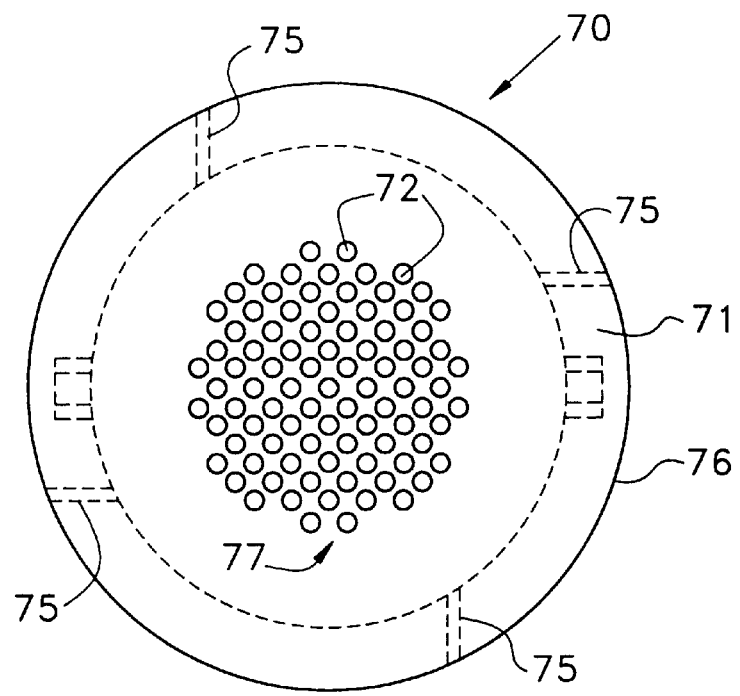

The foregoing electrode configurations 3 (comprised of the electrodes 30, 45), shown in FIG. 1 and FIG. 6, are suited primarily for the treatment of thin webs and films due to the small discharge volume which is created. The plasma treatment of a three-dimensional object, such as a bottle, requires the production of a plasma that will exist outside of the interelectrode discharge gap (the gap 55 of FIG. 6). This can be accomplished using a dielectric covered electrode in combination with a grid electrode. FIG. 11 illustrates one such arrangement 70, combining a dielectric covered (shaped) electrode 30 and a plate electrode 71 with multiple holes 72. The plate (or grid) electrode 71 is supported parallel to the dielectric covered electrode 30 using an appropriate dielectric support 73. The support 73 also acts as a gas barrier for the supply gas which is fed into the resulting interelectrode discharge volume 74. The supply gas is introduced through four ports 75 which are arranged so that the longitudinal axis of each port 75 is tangential to the edge 76 of the grid. The plate electrode 71 includes a grid pattern 77 defined as an arrangement of uniformly spaced holes 72 located within an area corresponding to the flat portions (the face 32) of the lower electrode 30. Since cooling of the plate electrode 71 is limited to convection from the supply gas and radiative cooling, this electrode should be constructed of a heat resistant metal (e.g., a 310 or 309 stainless steel). The openings of the grid pattern should collectively range from 20 percent to 60 percent of the total surface of the plate electrode 71.

The dielectric barrier layer 33 used for this configuration is typically thicker than that used with a pair of shaped electrodes as previously described (i.e., as in FIGS. 2a and 2b). The edges of the grid pattern holes 72 tend to produce a less uniform plasma, and more thermal stress on the dielectric. For this reason, the cavity 78 of the shaped electrode is preferably filled with a temperature regulated fluid. The permanent magnets 51 discussed earlier can also be positioned within the cavity 78, if desired.

Once a plasma discharge is initiated with the arrangement 70, a plasma (and active species) will escape the discharge zone 74 with the supply gas, developing plumes 79. Ultraviolet radiation will also pass through the grid holes 72. A substrate (or other object) to be plasma treated can then be manipulated in the plasma plumes 79 generated by this arrangement. Such a plasma discharge has been sustained in carbon dioxide, with resonant LC excitation using the network 65 of FIG. 9. The plate electrode 71 used had a 40% grid opening, with holes 72 having a diameter of 3.2 mm. The discharge power (of the power source 66) was close to 1 kw for a 9 cm grid diameter. No magnets were used in the shaped electrode 30, which had a diameter of 10 cm, and which included a Pyrex™ dielectric having a thickness of 3.2 mm.

The foregoing can also be used for the treatment of conducting materials. Since the conducting materials will in such case be treated external to the discharge zone, they can be kept electrically isolated from the excitation network.

The pulse discharge technique and the resonant LC discharge technique have been used with the electrode configuration shown in FIG. 6 to treat both polymer films and spunbond web materials. Polypropylene and polypropylene—polyethylene copolymer blends have been treated most frequently, due to more immediate commercial interests. The following table (Table 1) lists treatment conditions and results for four different samples. Both treatment techniques used a 10 cm (diameter) lower electrode having a 3 cm thick Macor™ dielectric cover. Samples 1 and 2 were treated with the pulse discharge technique, and employed a 7.6 cm (diameter) brass upper electrode. Samples 3 and 4 were treated with the resonant LC discharge technique, and used a 10 cm (diameter) copper upper electrode.

TABLE 1

| Sample Number | Treated Material Treatment Time | Gas Mixture, Blend Ratio[2] | Electrode Flow Rate, LPM[1] | Electrode, Gas Temperature °C. | Power Density Watts/cc | Results |
|---|---|---|---|---|---|---|
| | Pulse Discharge Technique | | | | | |
| 1 | Polypropylene - polyethylene copolymer film, 5 second exposure | $CO_2$, $O_2$ 7.6:4.3 | 150 | 60 | 12.7 | Reduced contact angle from 83° to 30° |
| 2 | Polypropylene spunbond 15 gr/m², 5 second exposure | He, $O_2$ 9.5:7.5 | 180 | 38 | 7.5 | Sample wettable, absorbtion time ≦ 3 sec. (3 month plus lifetime) |

TABLE 1-continued

| Sample Number | Treated Material Treatment Time | Gas Mixture, Blend Ratio[2] | Electrode Flow Rate, LPM[1] | Electrode, Gas Temperature ° C. | Power Density Watts/cc | Results |
|---|---|---|---|---|---|---|
| | Resonant Discharge Technique | | | | | |
| 3 | Straight polypropylene film (7 mil), 1.6 second exposure | He, $O_2$ 10:1.5 | 28 | 18 | 18.4 | Reduced contact angle from 80° to 40° |
| 4 | Polypropylene spunbond 30 gr/m², 1.6 second exposure | He, $O_2$ 5:1 | 35 | 20 | 26 | Sample wettable, absorbtion time ≦ 10 sec. |

Notes:
1. LPM is liters per minute.
2. Blend ratio is the volume flow rate ratio of the bottled supply gases.

The methods and electrodes of the present invention may be applied to a great variety of substrates. Such substrates can include, for example, bonded carded webs, spunbond webs or meltblown webs. The meltblown webs may include meltblown microfibers. The substrates treated in accordance with the present invention may have multiple layers such as, for example, multiple spunbond layers and/or multiple meltblown layers.

The substrate treated in accordance with the present invention may be thermoplastic resins, which include polyolefins such as polyethylene, polypropylene (including high density polyethylene), ethylene copolymers (including EVA and EMA copolymers with high tensile moduli), nylon, polyamids, polyterathalates, polyesters, polystyrene, poly-4-methylpentene-1, polymethylenemethacrylate, halogenated polyoefins such as fluoro- or chloro-substituted polyolefins such as polytrifluorochloroethylene, polyurethanes, polycarbonates, silicons, polyphenylene sulfide, and others. Other polyolefins, polyesters and polyamids are described in U.S. Pat. No. 5,965,122, which is incorporated herein by reference.

The polymers may be elastomeric or non-elastomeric. They may be hydrophilic or hydrophobic, or indifferent in that respect. The films treated in accordance with the present invention may be elastomeric or non-elastomeric. They may be porous or non-porous (impervious to gases and/or liquids). It is noteworthy that in accordance with the present invention, various characteristics of the surface of a film may be altered, specifically, to impart desirable properties.

Printability with various dyes and prints may be improved. Polyolefin films and other films of polymeric materials are notoriously difficult to print. In accordance with the present invention, this shortcoming may be overcome. Of particular interest is the treatment of packaging or food grade films such as those marketed under the name of SaranTM, and similar materials. For purposes of this discussion, the term "printability" refers to the acceptance of paint, dyes or similar materials, and hence includes dyability.

In accordance with the present invention, semiconductor wafers can be treated to etch the photoresist layer used in their manufacture. For example, a 4 inch diameter semiconductor wafer was etched with a gas mixture of 80% He and 20% $O_2$, for 5 minutes, at a discharge power of 100 watts. The wafer was adhered to the uppermost electrode (see FIG. 6), to ensure positive contact between the two structures. A negative pressure issuing from the face of the upper electrode was sufficient for this purpose. An effectively etched wafer was obtained.

It is also contemplated that in accordance with the present invention, the objectionable static properties of various films and other substrates may be altered, allowing such materials to be handled easier and used for applications not previously permitted because of their static properties.

When it is desired to treat elastomeric substrates to form elastomeric films, sheets or webs, the substrates may include the polyurethanes, polyamids and polyesters disclosed, for example, in U.S. Pat. No. 4,981,747, which is incorporated herein by reference. The formation of elastic sheets from polyester elastic materials is disclosed, for example, in U.S. Pat. No. 4,741,949, which is also incorporated herein by reference. Likewise, elastomeric films or sheets may be made from block copolymers such as (polystyrene/poly (ethylene-butylene)/polystyrene) block polymers, as is also disclosed in U.S. Pat. No. 4,981,747.

It will be noted that in accordance with the present invention, the substrate need not be exclusively made of synthetic material, but may include non-synthetic material and may be in the form of laminates or composites including wood pulp, cellulosic materials such as cotton or rayon staple fibers, and other similar non-synthetic materials frequently used in composites or laminates.

It will therefore be understood that various changes in the details, materials and arrangement of parts which have been herein described and illustrated in order to explain the nature of this invention may be made by those skilled in the art within the principle and scope of the invention as expressed in the following claims.

It should also be understood that various equivalent materials, structures or other means which perform substantially the same function in a substantially manner to accomplish relatively the same result are within the scope of the invention.

What is claimed is:

1. A method for generating a uniform, pulsed discharge plasma with a pair of electrodes, wherein each of the electrodes has an electrode face and wherein the faces of the electrodes are in opposing spaced relation to each other, the method comprising the steps of:

(a) introducing a working gas into a working volume between the opposing faces of the electrodes; and (b) exciting the electrodes by applying an asymmetrical primary voltage pulse with a pulse repetition frequency from about 1 to about 100 kHz to the pair of electrodes to generate the uniform plasma in the working gas, wherein the asymmetrical primary voltage pulse has an initial voltage rise followed by a substantially faster voltage fall.

2. The invention of claim 1, further comprising the step of treating a surface of a substrate with species of the generated plasma to alter one or more properties of the surface of the substrate.

3. The invention of claim 2, wherein each of the electrode faces has a plurality of holes, and which comprises the steps of transporting the substrate between the pair of electrodes, discharging the working gas from the holes in one of the electrode faces, and forming a vacuum through the holes in the other one of the electrode faces.

4. The invention of claim 2, wherein each of the electrode faces has a plurality of holes, and which further comprises the steps of transporting the substrate between the pair of electrodes, and discharging the working gas from the holes in each of the electrode faces.

5. The invention of claim 2, wherein the substrate is treated for a period of time less than 60 seconds.

6. The invention of claim 5, wherein the period of time is less than 20 seconds.

7. The invention of claim 2, wherein the substrate is located outside of the working volume and the plasma is convected out of the working volume and onto the surface of the substrate.

8. The method of claim 2 in which the surface of the substrate to be treated to alter one or more of its properties is a polymer selected from the group consisting of vinyl polymers, polyolefins, polystyrene, polyesters, nylons, silicones and polycarbonates.

9. The method of claim 8 in which the substrate of a spunbond polymer or a polymer film.

10. The method of claim 2 in which the surface of the substrate to be treated to alter one or more of its properties is a natural material selected from the group consisting of wool, cotton, leather and paper.

11. The invention of claim 1, wherein the working gas is maintained at or about one atmosphere of pressure.

12. The invention of claim 1, wherein at least one of the electrode faces has a plurality of holes which communicate with the working volume and the working gas is passed through the holes in the electrode face and introduced into the working volume at a determined temperature, humidity, and flow rate.

13. The invention of claim 12, further comprising the step of causing turbulence in the working gas discharged from the holes of the electrode face.

14. The invention of claim 1, wherein the asymmetrical primary voltage pulse has an amplitude of at least 1 kv, and a pulse width of 1 to 30 microseconds.

15. The invention of claim 1, wherein at least one of the electrodes has a gas receiving cavity separated into two portions by a partition, and which further comprises the steps of respectively introducing two different gases into the two separate portions of the gas-receiving cavity, and developing two separate plasma discharges.

16. The invention of claim 1, wherein the plasma has a power density of at least 5 watts/cm$^3$.

17. The invention of claim 1, wherein the asymmetrical primary voltage pulse has a rise time of approximately 1.25 microseconds.

18. The invention of claim 1, further comprising the step of applying a magnetic field to interact with the generated plasma.

19. The method of claim 1 in which the plasma in the working gas has a power density of 50 watts/cm$^3$.

20. The method of claim 1 in which the power density is in the range of about 18 to 26 watts/cm$^3$.

21. The invention of claim 1, wherein the voltage fall is about 5 times faster than the initial voltage rise.

22. The invention of claim 21, wherein the initial voltage rise is about 1.25 microseconds long and the voltage fall is about 250 nanoseconds.

23. The invention of claim 1, wherein, following each asymmetrical primary voltage pulse, is a secondary overshoot voltage pulse followed by one or more optional tertiary voltage pulses, wherein a discharge plasma is generated during the asymmetrical primary voltage pulse, but not during any tertiary voltage pulses.

24. The invention of claim 23, wherein a discharge plasma is also generated during the secondary overshoot voltage pulse.

25. The invention of claim 1, wherein the asymmetrical primary voltage pulse is a negative voltage pulse.

26. An apparatus for generating a uniform, pulsed discharge plasma, comprising:
(a) a pair of electrodes, wherein each of the electrodes has an electrode lace, wherein the faces of the electrodes are in opposing spaced relation to each other to establish a working volume between the opposing faces of the electrodes;
(b) a gas supply system configured to introduce a working gas into the working volume; and
(c) a pulse discharge circuit configured to excite the electrodes to generate the uniform plasma in the working gas, wherein the pulse discharge circuit is configured to generate an asymmetrical primary voltage pulse with a pulse repetition frequency from about 1 to about 100 kHz, wherein the asymmetrical primary voltage pulse has an initial voltage rise followed by a substantially faster voltage fall.

27. The invention of claim 26, wherein at least one of the electrode faces has a plurality of holes which communicate with the working volume and the working gas is passed through the holes in the electrode face and introduced into the working volume at a determined temperature, humidity, and flow rate.

28. The invention of claim 27, further comprising means for causing turbulence in the working gas discharged from the holes of the electrode face.

29. The invention of claim 26, further comprising means for transporting a substrate between the pair of electrodes to adjust one or more properties of a surface of the substrate, wherein each of the electrode faces has a plurality of holes, wherein the working gas is discharged from the holes in one of the electrode faces, and wherein a vacuum is formed through the holes in the other of the electrode faces.

30. The invention of claim 26, further comprising means for transporting the substrate between the pair of electrodes to adjust one or more properties of a surface of the substrate, wherein each of the electrode faces has a plurality of holes, and wherein the working gas is discharged from the holes in each of the electrode faces.

31. The invention of claim 26, further comprising a coil adapted to control the generated plasma by regulating the temperature of the working gas, wherein the coil is associated with an electrode having an electrode face with a plurality of holes.

32. The invention of claim 26, wherein the asymmetrical primary voltage pulse has an amplitude of at least 1 kv, and a variable pulse width of 1 to 30 microseconds.

33. The invention of claim 26, wherein at least one of the electrodes has a gas receiving cavity separated into two portions by a partition, and which further comprises means for respectively introducing two different gases into the two separate portions of the gas-receiving cavity, and for developing two separate plasma discharges.

34. The invention of claim 26, wherein the pulse discharge circuit generates the plasma having a power density of at least 5 watts/cm$^3$.

35. The invention of claim 26, wherein the face of one of the pair of electrodes for generating the plasma is approximately hyperbolic in shape.

36. The invention of claim 26, wherein the asymmetrical primary voltage pulse has a rise time of approximately 1.25 microseconds.

37. The invention of claim 26, further comprising a magnet adapted to apply a magnetic field to interact with the generated plasma.

38. The invention of claim 26, wherein the pulse discharge circuit comprises a pulse generator connected to a pulse transformer that converts pulse signals from the pulse generator into converted pulse signals that drive the electrodes during plasma generation.

39. The invention of claim 38, wherein the pulse discharge circuit further comprises one or more diodes and one or more resistors configured to control the shape of the converted pulse signals.

40. The invention of claim 26, wherein the voltage fall is about 5 times faster than the initial voltage rise.

41. The invention of claim 40, wherein the initial voltage rise is about 1.25 microseconds long and the voltage fall is about 250 nanoseconds.

42. The invention of claim 26, wherein, following each asymmetrical primary voltage pulse, is a secondary overshoot voltage pulse followed by one or more optional tertiary voltage pulses, wherein a discharge plasma is generated during the asymmetrical primary voltage pulse, but not during any tertiary voltage pulses.

43. The invention of claim 42, wherein a discharge plasma is also generated during the secondary overshoot voltage pulse.

44. The invention of claim 26, wherein the asymmetrical primary voltage pulse is a negative voltage pulse.

* * * * *